US012644989B2

(12) United States Patent
Negoro et al.

(10) Patent No.: US 12,644,989 B2
(45) Date of Patent: Jun. 2, 2026

(54) IMAGING DEVICE, DISTANCE ESTIMATION DEVICE, AND MOVING OBJECT

(71) Applicant: SEMICONDUCTOR ENERGY LABORATORY CO., LTD., Atsugi (JP)

(72) Inventors: Yusuke Negoro, Kaizuka (JP); Seiichi Yoneda, Isehara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 1070 days.

(21) Appl. No.: 17/634,035

(22) PCT Filed: Aug. 7, 2020

(86) PCT No.: PCT/IB2020/057460
§ 371 (c)(1),
(2) Date: Feb. 9, 2022

(87) PCT Pub. No.: WO2021/038343
PCT Pub. Date: Mar. 4, 2021

(65) Prior Publication Data
US 2022/0326384 A1        Oct. 13, 2022

(30) Foreign Application Priority Data

Aug. 23, 2019    (JP) ................................. 2019-152710
Sep. 6, 2019    (JP) ................................. 2019-162714

(51) Int. Cl.
*G01S 17/00*        (2020.01)
*G01B 11/22*        (2006.01)
(Continued)

(52) U.S. Cl.
CPC .............. *G01S 17/89* (2013.01); *G01B 11/22* (2013.01); *G01S 7/4816* (2013.01);
(Continued)

(58) Field of Classification Search
USPC ......................................................... 356/5.01
See application file for complete search history.

(56) References Cited

U.S. PATENT DOCUMENTS 8,378,391 B2    2/2013  Koyama et al.
8,586,905 B2    11/2013  Kurokawa
(Continued)

FOREIGN PATENT DOCUMENTS

CN        107204012 A    9/2017
EP        3279942 A    2/2018
(Continued)

OTHER PUBLICATIONS

Chen.Y et al., "Very Power Efficient Neural Time-of-Flight", arXiv:1812.08125, Dec. 19, 2018, pp. 1-10, Cornell University.
(Continued)

*Primary Examiner* — James R Hulka
(74) *Attorney, Agent, or Firm* — NIXON PEABODY LLP; Jeffrey L. Costellia

(57)        ABSTRACT

An object is to obtain accurate distance image data by denoising. Another object is to realize distance image data acquisition in a short time by reducing the frequency of accumulating. A distance image processing system including a solid-state imaging element that can be used for three-dimensionally recognizing an object is provided for the utilization of autonomous driving of passenger cars, for example. Image processing including distance information obtained by a TOF system solid-state imaging element, a so-called TOF camera, is performed by utilizing deep learn-
(Continued)

ing. A high-accurate distance image with noise reduced by deep learning can be obtained.

14 Claims, 13 Drawing Sheets

(51) Int. Cl.

| | |
|---|---|
| *G01S 7/481* | (2006.01) |
| *G01S 7/4865* | (2020.01) |
| *G01S 17/89* | (2020.01) |
| *H10F 30/225* | (2025.01) |
| *H10F 39/00* | (2025.01) |

(52) U.S. Cl.
CPC .......... *G01S 7/4865* (2013.01); *H10F 30/225* (2025.01); *H10F 39/8057* (2025.01)

(56) References Cited

U.S. PATENT DOCUMENTS

| | | | |
|---|---|---|---|
| 8,654,231 | B2 | 2/2014 | Kurokawa et al. |
| 8,916,869 | B2 | 12/2014 | Koyama et al. |
| 8,964,085 | B2 | 2/2015 | Kurokawa et al. |
| 9,024,248 | B2 | 5/2015 | Kurokawa |
| 9,153,619 | B2 | 10/2015 | Kurokawa et al. |
| 9,257,567 | B2 | 2/2016 | Kurokawa. et al. |
| 9,331,112 | B2 | 5/2016 | Koyama et al. |
| 9,515,107 | B2 | 12/2016 | Kurokawa. et al. |
| 9,575,381 | B2 | 2/2017 | Kurokawa et al. |
| 9,773,814 | B2 | 9/2017 | Koyama et al. |
| 10,095,076 | B2 | 10/2018 | Kurokawa et al. |
| 10,157,952 | B2 | 12/2018 | Tamaki et al. |
| 10,325,953 | B2 | 6/2019 | Kawahito |
| 10,535,689 | B2 | 1/2020 | Kurokawa |
| 10,535,691 | B2 | 1/2020 | Kurokawa. et al. |
| 10,741,600 | B2 | 8/2020 | Tamaki et al. |
| 10,841,491 | B2 | 11/2020 | Mathy et al. |
| 10,916,573 | B2 | 2/2021 | Kurokawa |
| 11,139,327 | B2 | 10/2021 | Kurokawa. et al. |
| 11,356,628 | B2 | 6/2022 | Nishino |
| 11,710,751 | B2 | 7/2023 | Kurokawa. et al. |
| 11,950,010 | B2 | 4/2024 | Nishino |
| 12,008,778 | B2 | 6/2024 | Kasuya et al. |
| 12,099,122 | B2 | 9/2024 | Sawamoto |
| 12,364,037 | B2 | 7/2025 | Kurokawa et al. |
| 2015/0340393 | A1* | 11/2015 | Tamaki ................. H10F 39/811 257/291 |
| 2017/0094220 | A1* | 3/2017 | Kurokawa ............. H04N 25/78 |
| 2017/0229486 | A1* | 8/2017 | Matsuda ............ H10D 30/6757 |
| 2017/0236842 | A1* | 8/2017 | Matsuda ............ H10D 30/6755 257/43 |
| 2017/0272651 | A1 | 9/2017 | Mathy et al. |
| 2018/0114809 | A1* | 4/2018 | Kawahito .............. H04N 25/77 |
| 2018/0252815 | A1 | 9/2018 | Shintani et al. |
| 2018/0372873 | A1 | 12/2018 | Koifman et al. |
| 2019/0052863 | A1 | 2/2019 | Yang |
| 2020/0007114 | A1* | 1/2020 | Kimura ................. G06N 3/063 |
| 2020/0028498 | A1* | 1/2020 | Kimura .................... G06N 3/04 |
| 2020/0296313 | A1* | 9/2020 | Nishino ............... H10F 30/225 |
| 2021/0257016 | A1* | 8/2021 | Kimura ............... G11C 7/1006 |
| 2021/0383881 | A1* | 12/2021 | Onuki .................... G11C 16/12 |
| 2022/0179088 | A1* | 6/2022 | Sawamoto ........... G01S 7/4863 |
| 2022/0272297 | A1* | 8/2022 | Nishino ............... G01S 7/4863 |
| 2023/0049977 | A1* | 2/2023 | Kurokawa ......... H10D 30/6755 |
| 2023/0132059 | A1* | 4/2023 | Kurokawa ............ G06N 3/048 257/40 |

FOREIGN PATENT DOCUMENTS

| | | | |
|---|---|---|---|
| EP | 3570534 | A | 11/2019 |
| EP | 3944612 | A | 1/2022 |
| JP | 2011-119711 | A | 6/2011 |
| JP | 2011-166123 | A | 8/2011 |
| JP | 2011-187944 | A | 9/2011 |
| JP | 2015-179864 | A | 10/2015 |
| JP | 2016-115914 | A | 6/2016 |
| JP | 2017-139496 | A | 8/2017 |
| JP | 2017-223648 | A | 12/2017 |
| JP | 2019-124537 | A | 7/2019 |
| JP | 2019-125116 | A | 7/2019 |
| JP | 2020-182147 | A | 11/2020 |
| WO | WO-2011/086848 | | 7/2011 |
| WO | WO-2011/099336 | | 8/2011 |
| WO | WO-2011/111549 | | 9/2011 |
| WO | WO-2016/157910 | | 10/2016 |
| WO | WO-2018/160381 | | 9/2018 |
| WO | WO-2019/087783 | | 5/2019 |
| WO | WO-2020/183533 | | 9/2020 |

OTHER PUBLICATIONS

Chen.Y et al., "A learning method to optimize depth accuracy and frame rate for Time of Flight camera", Materials Science and Engineering, Aug. 9, 2019, vol. 563, pp. 1-8, IOP Publishing.

International Search Report (Application No. PCT/IB2020/057460) Dated Nov. 24, 2020.

Written Opinion (Application No. PCT/IB2020/057460) Dated Nov. 24, 2020.

Koyama.S et al., "A 220 m-Range Direct Time-of-Flight 688 x 384 CMOS Image Sensor with Sub-Photon Signal Extraction (SPSE) Pixels Using Vertical Avalanche Photo-Diodes and 6 kHz Light Pulse Counters", 2018 Symposium on Vlsi Circuits Digest of Technical Papers, Jun. 18, 2018, pp. 71-72.

Chen.C et al., "Learning to See in the Dark", CVPR 2018 (Computer Vision and Pattern Recognition), Jun. 18, 2018, pp. 3291-3300.

* cited by examiner

First pair of transfer gates 71

Second pair of transfer gates 72

64(n+)

64(n+)

TX1

TX2

71

72

90

74

73

TX4

TX3

Charge-draining region 65(n+)

64(n+)

63(p+)

Fourth pair of transfer gates 74

90

Third pair of transfer gates 73

90

91

74

75

70

73 n p⁻ p 66     60     61     62     63(p+)     66

FIG. 9A
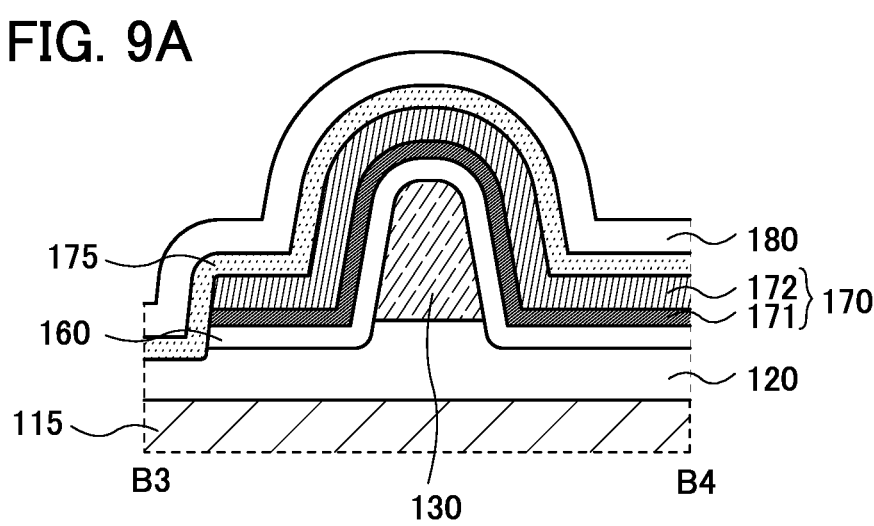
175
160
115
180
172 } 170
171 }
120
B3          B4
130
FIG. 9B
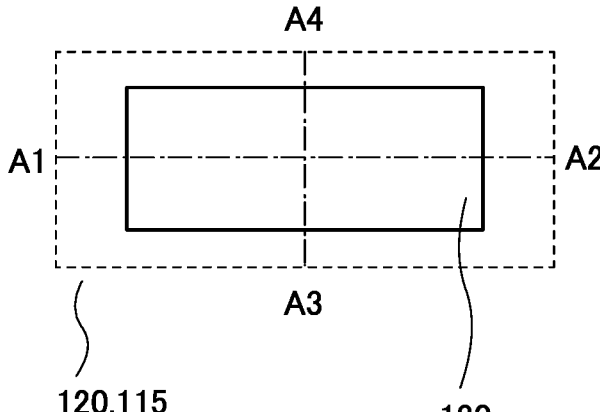
A4
A1          A2
A3
120,115          130
FIG. 9C
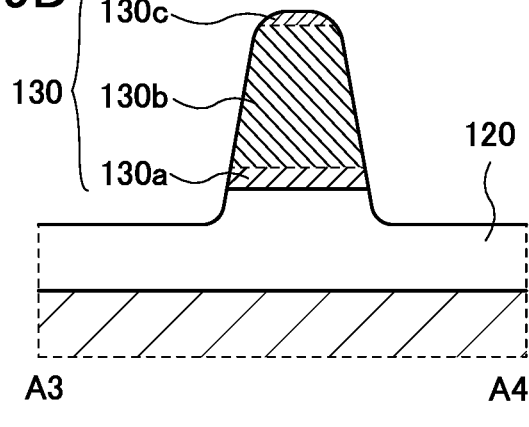
130
130a 130b 130c
120
A1          A2
115
FIG. 9D
130c
130 { 130b
130a
120
A3          A4

FIG. 13A
6100
6102
6101
6103
6105
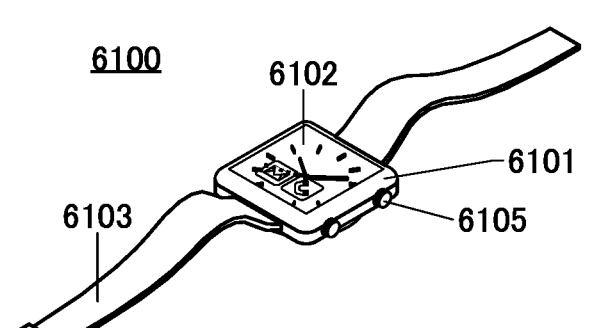
FIG. 13B
6204 6200
6202
6209
6203
6201
6205
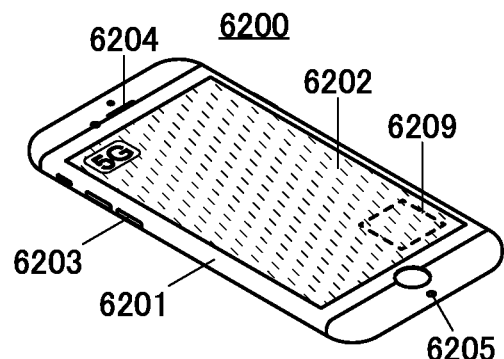
FIG. 13C
6300
6302 6301
6305
6310
6304
6303
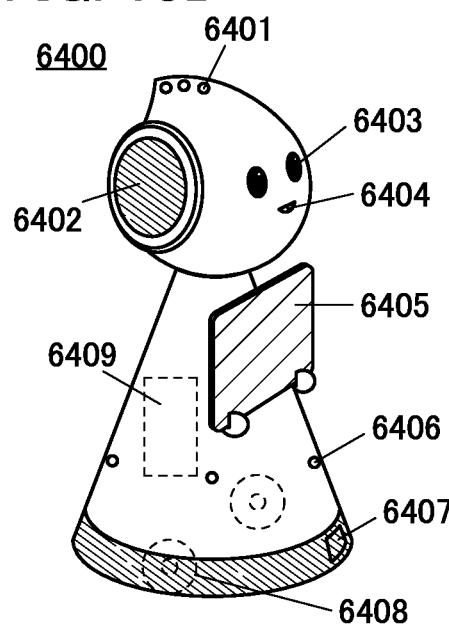
FIG. 13D
6400
6401
6403
6404
6402
6405
6409
6406
6407
6408
FIG. 13E
6500
6503 6501
6504
6502
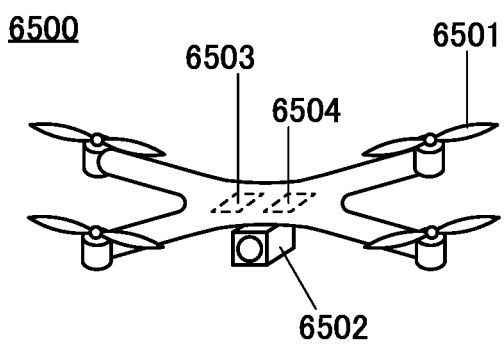
FIG. 13F
7160
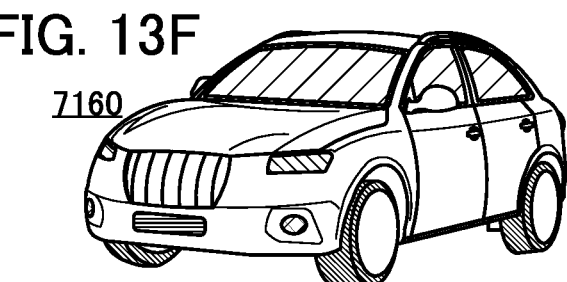

IMAGING DEVICE, DISTANCE ESTIMATION DEVICE, AND MOVING OBJECT

TECHNICAL FIELD

The present invention relates to a semiconductor device using an oxide semiconductor and a manufacturing method thereof. Another embodiment of the present invention relates to an imaging device. Another embodiment of the present invention relates to a distance estimation device and a distance estimation method.

Note that one embodiment of the present invention is not limited to the above technical field. One embodiment of the invention disclosed in this specification and the like relates to an object, a method, and a manufacturing method. One embodiment of the present invention relates to a process, a machine, manufacture, or a composition of matter. Therefore, specific examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

Note that in this specification, a semiconductor device refers to any device that can function by utilizing semiconductor characteristics, and an electro-optical device, a semiconductor circuit, and an electronic device are all semiconductor devices.

BACKGROUND ART

In recent years, many and various researches utilizing three-dimensional information have been made. There is a generally known method in which three-dimensional information is constructed on the basis of a multi-viewpoint image obtained by two or more parallel-placed cameras. This method can be conducted at a low cost, but is inadequate for autonomous driving of a car and has a difficulty in measuring a distance with high accuracy.

As a means for measuring a distance, a method (also referred to as a TOF system) in which irradiation of light such as infrared light is performed and the reflected light is utilized to obtain three-dimensional information has attracting attentions. In the distance measurement with the TOF system, a light source and a light detector (sensor or camera) are used. A camera used in the TOF system is referred to as a time-of-flight camera, and also as a TOF camera. The TOF camera can obtain distance information between a light source emitting light and an object on the basis of time of flight of reflected light of light delivered on the object.

Furthermore, there is a direct TOF measurement method in which TOF is directly measured in a time region and an indirect TOF measurement method in which measurement is conducted with use of a change of a physical quantity depending on TOF and a time standard for converting the change of the physical quantity into temporal change. The TOF is disclosed in Non-Patent Document 1.

However, TOF cameras can receive weak light reflected by a distant object for only a short time, and thus a signal is easily buried in a noise.

Patent Document 1 discloses that transistors including an oxide semiconductor are used for both a reset transistor and a transfer transistor in solid-state imaging element.

A dataset and a method for correcting an image captured in the dark with use of machine learning are described in Non-Patent Document 2.

REFERENCE

Patent Document

[Patent Document 1]
Japanese Published Patent Application No. 2011-119711

Non-Patent Document

[Non-Patent Document 1]
VLSI2018, Panasonic, S Koyama et al., "A 220 m-Range Direct Time-of-Flight 688×384 CMOS Image Sensor with Sub-Photon Signal Extraction Pixels Using Vertical Avalanche Photo-Diodes and 6 kHz Light pulse Counter"
[Non-Patent Document 2]
CVPR 2018, Chen Chen et al., "Learning to See in the Dark"

SUMMARY OF THE INVENTION

Problems to be Solved by the Invention

If a signal is buried in a noise, it is difficult to recognize an image of a measurement object with low reflectance.

Distance image data can be obtained in a manner that light from a light source is reflected by an object and a light-receiving element receives the reflected light and generates charges, and a distance to the object is obtained by accumulation using the generated charges. To improve a resolution, measurement is repeated many times, and accumulating and averaging are performed in some cases.

An object is to obtain an accurate distance image data by denoising. Another object is to achieve distance image data acquisition in a short time by reducing the frequency of accumulating.

Another object is to provide a distance image processing system including a solid-state imaging element that can be used for three-dimensionally recognizing an object, for autonomous driving of a passenger car and the like.

It is necessary to improve a temporal resolution to improve a range resolution of a TOF camera. When the temporal resolution is attempted to be improved, exposure time is shortened to cause a decrease in signal intensity. Multiple times of measurements are performed repeatedly to store charges to increase the signal intensity; however, there is a problem of a leakage in a transistor using single crystal silicon. In addition, in the transistor using single crystal silicon, there is a problem of a variation in leakage current in an off-state. In particular, the off-state current is likely to be changed. Therefore, in the case where a charge retention semiconductor device such as a solid-state imaging element is formed, it is hoped that a device capable of holding an adequate potential retention period regardless of the surroundings and having lower off-state current characteristics will be developed.

Furthermore, there is a problem of noise due to leakage in an off state of a transistor using single crystal silicon. There is a problem that denoising is difficult because leakage in an off-state of the transistor using single crystal silicon cannot be reduced.

Moreover, the integration or downsizing of semiconductor circuits used for TOF cameras is desired.

Means for Solving the Problems

Image processing including distance information obtained by a TOF-system solid-state imaging element, a so-called TOF camera, is performed by utilizing deep learning. A high-accuracy distance image with noise reduced by deep learning can be obtained.

Distance information is configured with a plurality of spatial slices, and can be one distance image obtained by overlapping a plurality of object information in the plurality of spatial slices for respective distances over the entire space to be recognized. In the TOF system, light emitting from a light source is delivered to an object and the reflected light is used. For example, an image of an object is obtained for every distance is obtained, specifically, information of an object present in the distance from a solid-state imaging element that is greater than or equal to 1 m or less than 45 m, information of an object present in the distance that is greater than or equal to 45 m or less than 90 m, and information of an object present in the distance that is greater than or equal to 90 m or less than 135 m, and the obtained images are overlapped so that one distance image of the distance of greater than or equal to 1 m and less than 135 m can be obtained.

A structure of the invention disclosed in this specification is a distance estimation device including: a light source emitting light to an object in a measurement space; a light-receiving region of a solid-state imaging element receiving light reflected by the object; an image generation portion generating first three-dimensional image data on the basis of carriers generated from the light-receiving region; an input portion inputting the first three-dimensional image data; an estimation portion conducting image processing, with a processor, on the first three-dimensional image data, using a learning model learned with teacher data; and an output portion generating second three-dimensional image data having a higher accuracy than the first three-dimensional image data.

In the above structure, a large number of the teacher data whose frequency of accumulating are higher than the frequency of accumulating for the first three-dimensional image data are used in the learning model. Three-dimensional image data subjected to a high frequency of accumulating is learned and a learning model that can have the highest accuracy in the output portion is used.

The learning model may be configured in such a manner that a positional relationship between the TOF camera and the three-dimensional coordinates of an object is learned in advance.

In the above structure, the second three-dimensional image data is a depth map of the measurement space.

In the above structure, the image processing is performed by deep convolutional neural network. Specifically, a U-shape network, a so-called U-Net method, is used. The U-Net method is one of discriminative extraction methods used for two-dimensional images. In addition, an FCN (Fully Convolutional Network) method can also be used. Note that the U-Net method is an improvement and development of the FCN method. A 3D-Net method or a V-Net method, which are three-dimensionally extended versions of the U-Net method, can also be used.

Note that a neural network refers to a mathematical model that aims at an expression by computer simulation of characteristics of a biological brain. The convolutional neural network refers to a feedforward network where a layer having a plurality of units is connected in one direction from an input stage to an output stage, and that has a convolution layer where units on the output side are connected to particular adjacent units on the input sides.

In the above structure, the distance to the object is estimated in such a manner that a temporal range corresponding to a distance from the light source is divided into a plurality of measurement sections and the distance to the object is estimated on the basis of a time during light emitted from the light source is reflected from a measurement section where the object is present and reaches the light-receiving region.

The image generation portion calculates an accumulation value or an average value of an electric output corresponding to the amount of received light of the solid-state imaging element and estimates a distance on the basis of the value. In addition, the image generation portion obtains a distance using the amount of charges obtained by accumulating current in a plurality of detection periods for every light-receiving period and regards the distance as a pixel value of a distance image.

In the case where the solid-state imaging element is used as a fixed camera used for crime prevention, an image obtained by increasing the frequency of accumulating is used for learning data; thus, a distance image with substantially the same accuracy as an image with an increased frequency of accumulating can be obtained with use of a captured data with a low frequency of accumulating. Moreover, an image obtained by increasing the frequency of accumulating is subjected to image processing for denoising and is used as learning data; thus, a distance image with an accuracy higher than or equal to an image with an increased frequency of accumulating can be obtained with use of a captured data with a low frequency of accumulating.

For the estimation portion, a micon can be used, for example. Note that a micon refers to a microcomputer or a microprocessor to which program capable of executing an algorithm such as arithmetic operation is ported. The microcomputer refers to a small computer constituted by a microprocessor, a memory, a peripheral chip, and the like.

The estimation portion may be configured with LSI (Large Scale Integration) integrally fabricated on one chip. The technique of circuit integration is not limited to LSI, and circuit integration may be implemented by a dedicated circuit or a general-purpose processor. An 8-bit, 16-bit, 32-bit, 64-bit, or 128-bit processor may be used as the processor, for example. Examples of the processor include a microprocessor, a co-processor, and a floating-point processor. It is also possible to use an FPGA (Field Programmable Gate Array) that is programmable after LSI fabrication, or a reconfigurable processor that is capable of reconfiguring connections and settings of circuit cells inside the LSI.

A weight parameter or a pixel value is stored in, for example, a memory in the estimation portion, specifically, a ROM (Read Only Memory) or a RAM (Random Access Memory). The estimation portion can calculate a distance image more accurately.

It is possible to achieve a distance image processing method in which a plurality of processes including neural network processing are executed sequentially and which has a plurality of steps. It is also possible to achieve a computer program in which a computer executes each step included in the distance image processing method. In addition, such a computer program can be stored in a storage medium or a cloud via an Internet communication network and executed.

A structure of the invention disclosed in this specification is an imaging device including a light-receiving region; a plurality of charge-accumulation regions around the light-receiving region; a transistor using an oxide semiconductor at least partly overlapping the charge-accumulation regions; and a light-shielding plate overlapping with the plurality of charge-accumulation regions and the transistor.

Another structure of this invention is an imaging device including a semiconductor wafer where at least a light-receiving region, a charge-accumulation region, and a first transistor are embedded; and a second transistor at least partly overlapping the charge-accumulation region. The second transistor includes an oxide semiconductor in a channel formation region.

In the above structure, a light-shielding plate is further included. The light-shielding plate is overlapped with the charge-accumulation region, the first transistor, and the second transistor.

One light-receiving region is regarded as one pixel and a sensor is configured with pixels inn rows and m columns (nxm). Note that n or m is a natural number of 2 or more, for example, n and m may be 32 and 32, respectively. The increase in the number of n or m easily leads to an expansion of a circuit scale. With the expansion of a circuit scale, it is difficult to maintain the simultaneity in measurement between pixels and thus it is also difficult to achieve a high temporal resolution.

A transistor using an oxide semiconductor layer is stacked over the charge-accumulation region to be partially overlapped, and thus the circuit area can be reduced without changing a circuit scale, leading to downsizing of a chip. By the stack, a high temporal resolution can be achieved.

In the above structure, the light-receiving region corresponds to a light-receiving area of an embedded photodiode or a light-receiving area of an avalanche photodiode.

An avalanche photodiode that detects a single photon is referred to as a SPAD (Single Photon avalanche diode), and when a large negative voltage is applied to a cathode, an electron generated by incidence of one photon causes avalanche multiplication, so that a large current flows.

An electron pulse with the arrival time of one photon as a start point is generated. The speed of the avalanche multiplication is very fast; thus, the arrival time of the photon can be found on the basis of the timing of generation of the electron pulse, and can be used to measure the time of flight of light.

Furthermore, leakage can be reduced with use of the transistor using an oxide semiconductor layer, and the influence of noise can be reduced.

For example, the oxide conductive layer preferably includes indium and further preferably includes an In-M-Zn oxide (M is Al, Ti, Ga, Y, Zr, La, Ce, Nd, Sn, or Hf).

The electric field control electrode is used for high-speed charge transfer, a voltage is applied to a pair of electric field control electrodes to generate a fringing field, a photoelectron generated in the light-receiving region is transferred to the charge-accumulation region. By controlling potentials of a plurality of electric field control electrodes to give a potential gradient, the photoelectron generated in the light-receiving region is transferred to a desired charge-accumulation region. A stack of insulating layers is provided over the charge-accumulation region and the stack of insulating layers has an opening partly overlapping with the light-receiving region. The stack of insulating layers is formed in formation of the transistor using an oxide semiconductor layer. When the insulating layers are kept stacked at a position overlapping the light-receiving region, incident infrared light is refracted and the amount of light to reach the light-receiving region is reduced, in which case the stack of insulating layers may be removed. An opening is formed in the stack of insulating layers overlapping the light-receiving region, whereby infrared light can efficiently enter the light-receiving region.

In addition, a reset transistor is also connected to any of the charge-accumulation regions and resets charges of charge-accumulation regions.

In addition, the delay time (time of flight of light) of the received light pulse with respect to the output light pulse can be measured in such a manner that light is received with use of a plurality of photodiodes and a known method is employed. Furthermore, a distance corresponding to the delay time (time of flight of light) can also be measured by a known method.

FIG. 1 is a schematic view of a TOF camera. In FIG. 1, an illumination unit 11 is a light source such as LED and a distance between an object A and the light source is different from a distance between an object B and the light source. The object A and the object B are objects which are irradiated with light from the illumination unit 11. Each of reflected light by the object A and the object B is sensed by a sensor unit 12 having a solid-state imaging element. The sensor unit 12 is a sensor in which one solid-state imaging element is regarded as one pixel and a plurality of solid-state imaging elements are provided over two-dimensional plane.

In an indirect TOF measurement method, a high-frequency wave as signal light from a light source, for example, light modulated at 10 MHz (high-frequency modulated light) is delivered on the object A or the object B, reflected light originating from the high-frequency modulated light is regarded as a signal, and a distance between the object A or the object B, the sensor unit 12, and the illumination unit 11 is measured on the basis of a phase difference between the high-frequency modulated light from the illumination unit 11 and the reflected light.

That is, in the judgement of the phase difference and measurement, data obtained in the sensor unit 12 and data of a signal generation unit 13 are used in a correlation and evaluation unit 14. Note that the illumination unit 11 emits light on the basis of an instruction from the signal generation unit 13.

The phase difference, that is, a phase delay, is converted to a distance to be measured using a cycle length and light velocity. The conversion is performed on every pixel, so that the distance difference between the object A and the object B can be calculated.

In this specification, the TOF camera means a device including not only the sensor unit 12 but also the illumination unit 11, the correlation and evaluation unit 14, the signal generation unit 13, and the like, and is referred to as an imaging device.

Effect of the Invention

A distant image with high accuracy can be obtained from a distance image with much noise by using deep learning. Therefore, the present invention is also useful for unmanned operation vehicles or manufacturing machines such as industrial robots, each of which utilizes distance image data.

For example, a distance image from a vehicle can be estimated by transplanting models and parameters obtained by learning using the neural network to an in-vehicle micro-computer or microprocessor (hereafter also referred to as micon), or the like and can be output, in the case where a TOF camera is mounted in the vehicle.

It is possible to reduce noise due to leakage in an off state of a transistor using single crystal silicon and to achieve a high temporal resolution.

The integration or downsizing of semiconductor circuits used in TOF cameras can be achieved.

BRIEF DESCRIPTION OF THE DRAWINGS

FIG. 9A is a cross-sectional view of a transistor used in a solid-state imaging element illustrating one embodiment of the present invention; FIG. 9B is a top view of an oxide semiconductor layer 130 of the transistor; and FIG. 9C and FIG. 9D are cross-sectional views thereof.

FIG. 13A, FIG. 13B, FIG. 13C, FIG. 13D, FIG. 13E, and FIG. 13F are diagrams illustrating usage modes of the present invention.

MODE FOR CARRYING OUT THE INVENTION

Embodiments of the present invention are described in detail below with reference to the drawings. Note that the present invention is not limited to the following description, and it is readily understood by those skilled in the art that modes and details of the present invention can be modified in various ways. In addition, the present invention should not be construed as being limited to the description of the following embodiments.

Embodiment 1

Figures 2A, 2B:
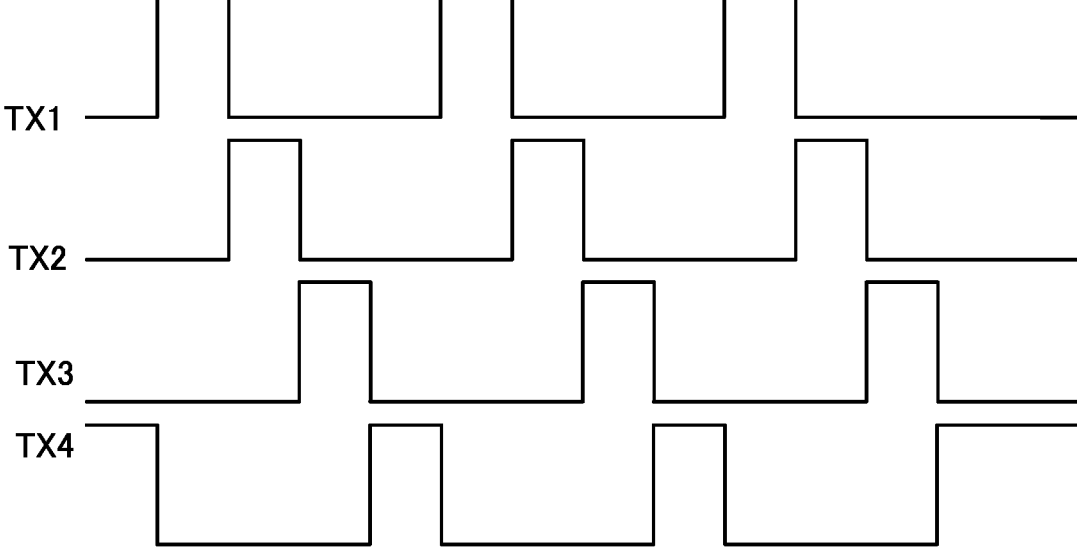
FIG. 2A is an example of a circuit diagram illustrating one embodiment of the present invention and FIG. 2B is a diagram illustrating a timing chart.

FIG. 2A illustrates a circuit diagram illustrating one pixel configuration. The pixel circuit illustrated in FIG. 2A includes at least a photodiode, a plurality of transistors, and capacitors. A cathode of the photodiode is electrically connected to one of a source and a drain of a transistor 22. A gate of the transistor 22 is electrically connected to a wiring TX1, and the other of the source and the drain of the transistor 22 is electrically connected to one electrode of a capacitor 41, one of a source and a drain of a transistor 25, and a gate of a transistor 31. The one of the source and the drain of the transistor 25 is electrically connected to a wiring VRS.

One photodiode (PD), one reset transistor (21), and three charge-transfer transistors (22, 23, and 24) are formed as one pixel in a silicon wafer and transistors using an oxide semiconductor (25, 26, and 27) are stacked thereover. Capacitors 41, 42, and 43 may be formed in the silicon wafer or may be formed in a layer thereover.

Each of the three charge-transfer transistors (22, 23, and 24) is connected to a storage node FD. Time is measured by changing the timing of storing charges in the storage node. The photodiode PD is reset with the reset transistor 21, except at the timing of storing charges in the storage node. Furthermore, FIG. 2B illustrates an example of a timing chart of signals supplied to wirings TX1, TX2, TX3, and TX4.

In a conventional manner, a photodiode and a reading circuit are formed in a silicon wafer; thus, the total chip area is the sum of the area occupied by the photodiode and the area occupied by the reading circuit. The transistors 31, 32, and 33 are part of a reading circuit. In this embodiment, the transistors 31, 32, and 33, and the capacitors 41, 42, and 43 are formed in a silicon wafer at a position not overlapping a light-receiving region and are electrically connected to each other.

In addition, by forming the reading circuit or part thereof using the transistors using an oxide semiconductor, the occupation area can be reduced by adopting the stack structure. Thus, an occupation area of a light-receiving region of an embedded photodiode can be increased and the total area of a chip can be reduced.

Figure 3:
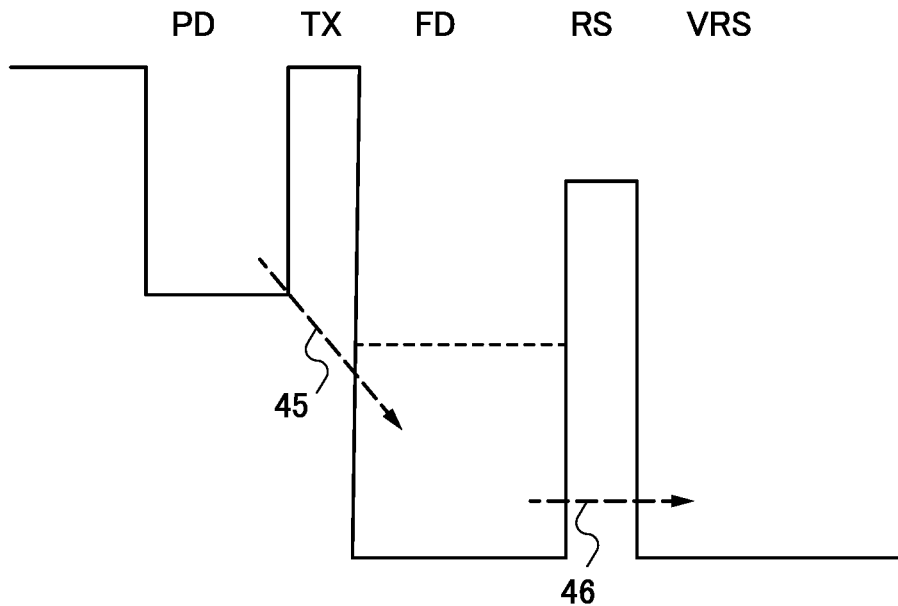
FIG. 3 is an example of a potential diagram illustrating one embodiment of the present invention.

FIG. 3 illustrates a potential diagram in the case where a Si-embedded photodiode is used. In the potential diagram, the lower direction (depth direction) in the diagram is expressed as a positive direction of a potential. Leakage paths in the case where charges are accumulated in FD are two paths: a path from the photodiode PD to the storage node FD through the transistor 22 (a dotted arrow 45 in FIG. 3) and a path from the storage node FD to the wiring VRS through the transistor 25 (a dotted arrow 46 in FIG. 3). A gate RS of the transistor 25 controls supply of charges from the wiring VRS to the storage node FD. The first leakage path from the photodiode PD is not nearly a problem as long as reset is performed with the wiring TX4, but the second leakage path from the storage node FD to the wiring VRS is a problem. To solve the problem, the transistors using an oxide semiconductor are used in this embodiment. The transistor 25 using an oxide semiconductor has little leakage, and thus noise due to leakage is reduced and a high accuracy measurement is possible.

In addition, in place of the photodiode PD, an avalanche photodiode that can conduct detection with energy with a lower intensity than that of the embedded photodiode can also be used.

In this embodiment, although the three charge-transfer transistors (22, 23, and 24) are exemplified, there are no particular limitations, and two transistors or four or more transistors may be used.

In addition, the silicon wafer is used in the example, but a compound semiconductor substrate can be used, for example, without being particularly limited to silicon.

Embodiment 2

In this embodiment, an example of using an avalanche photodiode that can conduct detection with light energy lower than that of a PIN photodiode is described below.

Figure 4:
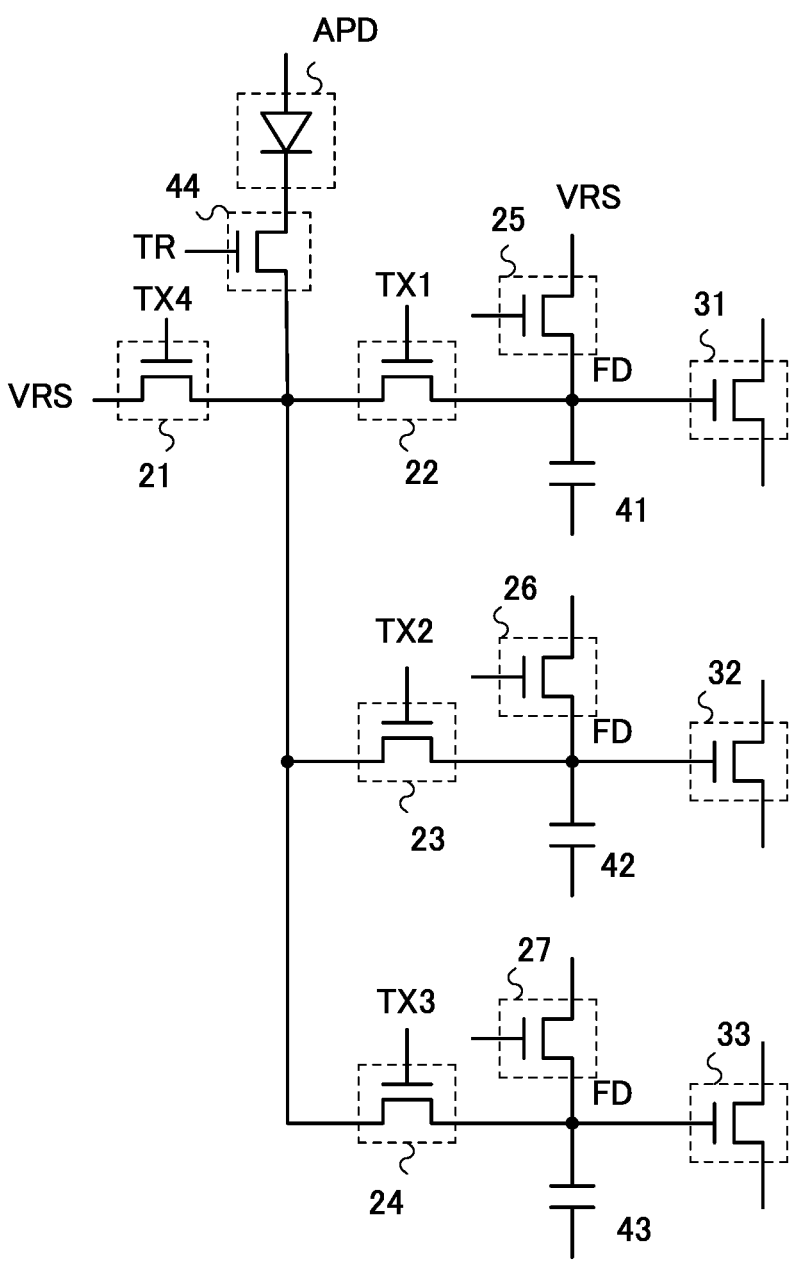
FIG. 4 is an example of a circuit diagram illustrating one embodiment of the present invention.
Figure 5:
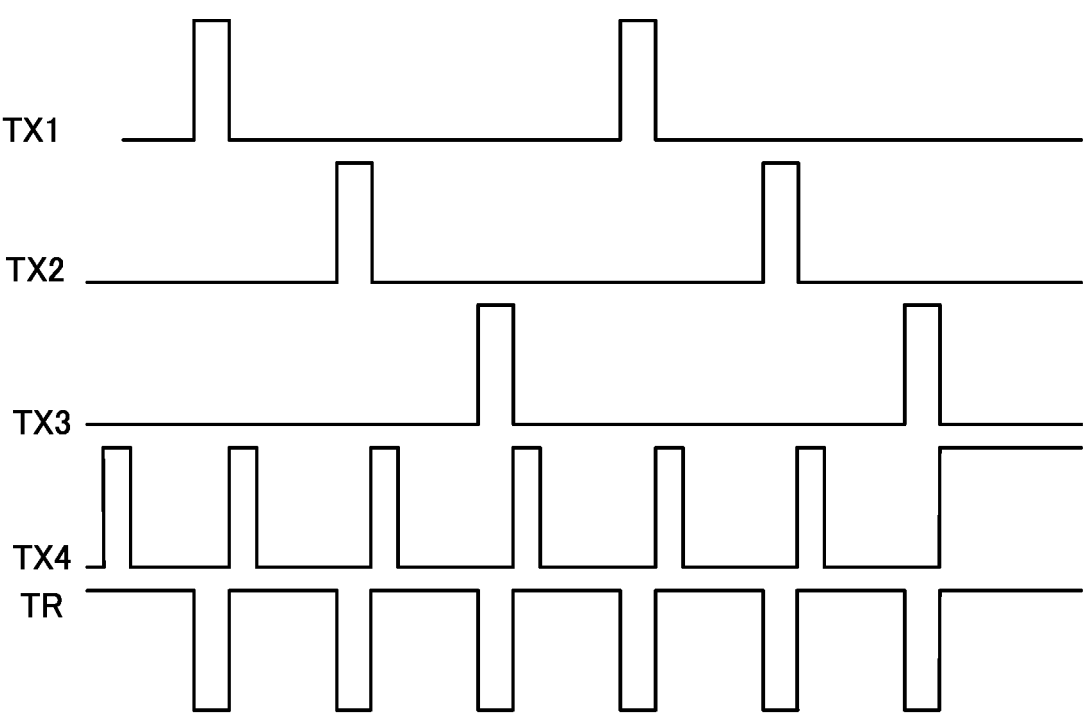
FIG. 5 is an example of a diagram illustrating a timing chart illustrating one embodiment of the present invention.

FIG. 4 illustrates an example of a pixel circuit using an avalanche photodiode APD. FIG. 5 illustrates an example of a timing chart of signals to be applied to the wirings TX1, TX2, TX3, and TX4. The avalanche photodiode APD has a function of multiplying carriers generated in the element by application of a negative voltage to its cathode and can have a multiplication factor in accordance with an applied bias.

When the number of incident photons is small, a plurality of times of measurement and accumulating are conducted; thus, noise can be reduced also in the case of using avalanche photodiode APD. In accumulating, repeatedly accumulation is possible when the capacitance on the storage node FD side is much higher than that on the avalanche diode APD side.

In this embodiment, since the capacitance on the avalanche photodiode APD side is high, the transistor 44 is added to the avalanche photodiode APD side to lower the capacitance. When the wiring of the transistors 22, 23, and 24 (any one of TX1, TX2, and TX3) is set High and charge is transferred, a gate TR of the transistor 44 is controlled to turn the avalanche photodiode APD off, so that the capacitance can be lowered. In that case, since charge is left on the avalanche photodiode APD, the avalanche photodiode APD needs to be reset every charge transfer.

In this embodiment, the transistor 44 is formed in the silicon wafer like the three charge-transfer transistors (22, 23, and 24). In addition, the transistors (25, 26, and 27) using an oxide semiconductor are formed above the silicon wafer. The size of one pixel can be reduced by using transistors using an oxide semiconductor for part of a driver circuit such as a reading circuit. Moreover, part of the driver circuit such as a reading circuit is formed using transistors using an oxide semiconductor, whereby the area of the light-receiving region can be enlarged, in comparison in the case of the same pixel size.

By using this device, a distance image sensor using a direct TOF measurement method can be manufactured.

In this embodiment, although the three charge-transfer transistors (22, 23, and 24) are exemplified, there are no particular limitations, and two transistors or four or more transistors may be used.

Embodiment 3

An example of a solid-state imaging element that includes the photodiode embedded in the silicon wafer described in Embodiment 1 is described.

Figures 6A, 6B:
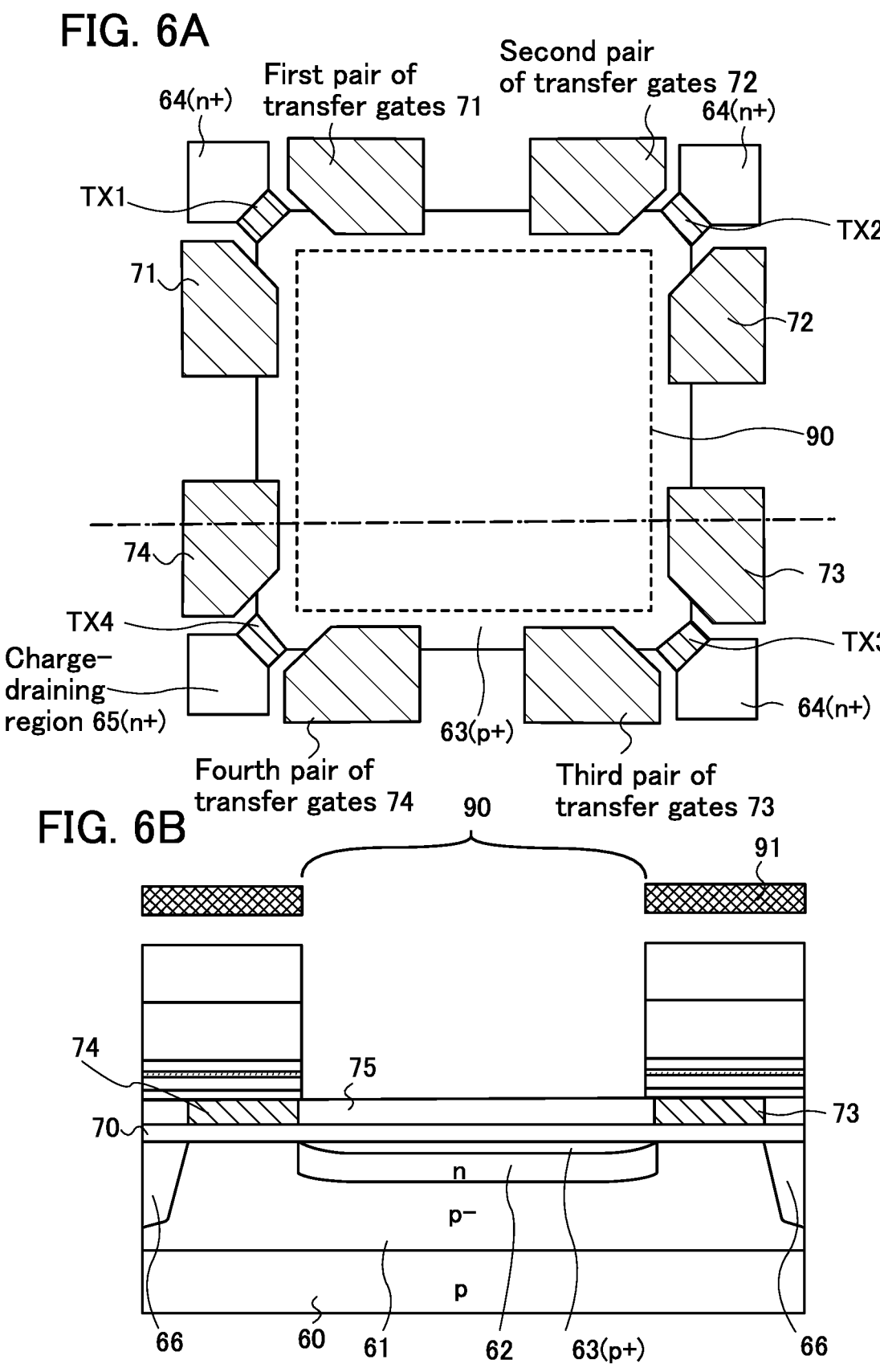
FIG. 6A and FIG. 6B are a top view and a cross-sectional view, respectively, of a solid-state imaging element illustrating one embodiment of the present invention.

FIG. 6A illustrates an example of layout in which a plurality of charge-accumulation regions 64 and a charge-draining region 65 that are n-type regions formed by addition of an impurity element or the like to a p-type silicon wafer, a light-receiving region 90 of a photodiode, and a plurality of pairs of transfer gates are arranged. Although not illustrated in FIG. 6A, a light-shielding plate whose opening is a region overlapping with a light-receiving region 90 is provided and fixed above the light-receiving region surrounded by a dotted line. Note that in FIG. 6A, the layout of a transistor using an oxide semiconductor that is provided below the light-shielding plate and over the silicon wafer is not illustrated for simplification. Below the light-shielding plate, the transistor using an oxide semiconductor can be placed over the silicon wafer with an insulating layer therebetween, which enables integration.

In addition, although FIG. 6A and FIG. 6B illustrate the plurality of pairs of transfer gates and wirings TX1, TX2, TX3, and TX4 having island-shapes, they are not floating electrodes and connected to wirings above that are laid-out so that desired voltages can be applied thereto.

A micro lens may be provided at a position that is above the light-receiving region 90 and overlaps with the opening of the light-shielding plate 91. The micro lens can condense light reflected by an object apart from a light source and deliver the condensed light to the light-receiving region 90. Note that the light-shielding plate having an opening overlapping with the light-receiving region is not illustrated and is omitted in FIG. 6A.

FIG. 6B is a schematic cross-sectional view taken along the dashed-dotted line in FIG. 6A.

In FIG. 6B, some insulating layers (a stack of insulating layers) overlapping with the light-receiving region 90 are selectively removed, so that the light-receiving region 90 has an opening in the stack of insulating layers to easily receive light. The process for forming the opening in the stack of insulating layers can be performed in the same process as the manufacturing process of the transistor including an oxide semiconductor, and thus there is almost no increase in the number of steps. In this embodiment, above the light-receiving region 90, the opening is provided to reduce the influence of the refractive index due to the stack of insulating layers at the position overlapping with the light-receiving region 90; however, the opening is not necessarily provided as long as adequate infrared light reflected by the object can be received. In FIG. 6B, the light-receiving region 90 is covered with only a stack of a first insulating layer 70 and a second insulating layer 75. The first insulating layer 70 and the second insulating layer 75 are formed using an inorganic insulating material having a high-transmitting property, for example, silicon oxide. The first insulating layer 70 can be formed using a field oxide film. Top surfaces of the first insulating layer 70 and the second insulating layer 75 are preferably planarized by a CMP (chemical mechanical polishing) method or the like as necessary.

Element isolation with p-well regions 66 is performed in order to separate transistors. In addition, the p-well regions 66 can form guard rings.

The light-receiving region 90 is embedded in the silicon wafer. FIG. 6B illustrates a p-type region 60 of the wafer itself, and a p– region 61, an n-type surface embedded region 62, a p+ region 63, the first insulating layer 70, and the second insulating layer 75 are stacked over the p-type region 60. A photodiode structure where a large number of carriers are generated in the n-type surface embedded region 62 is employed. A depletion potential in the n-type surface embedded region 62 is gradually changed, so that the destination where a large number of carriers are transferred is controlled to be any one of the three charge-accumulation regions 64, and a distance image is captured. The control is performed by appropriately adjusting voltages applied to the wirings TX1, TX2, TX3, and TX4 and a first pair of transfer gates 71, a second pair of transfer gates 72, a third pair of transfer gates 73, and a fourth pair of transfer gates 74.

Note that the first pair of transfer gates 71, the second pair of transfer gates 72, the third pair of transfer gates 73, and the fourth pair of transfer gates 74 are not particularly provided, as long as the transfer of the large number of carriers can be controlled with the wirings TX1, TX2, TX3, and TX4.

Figure 7:
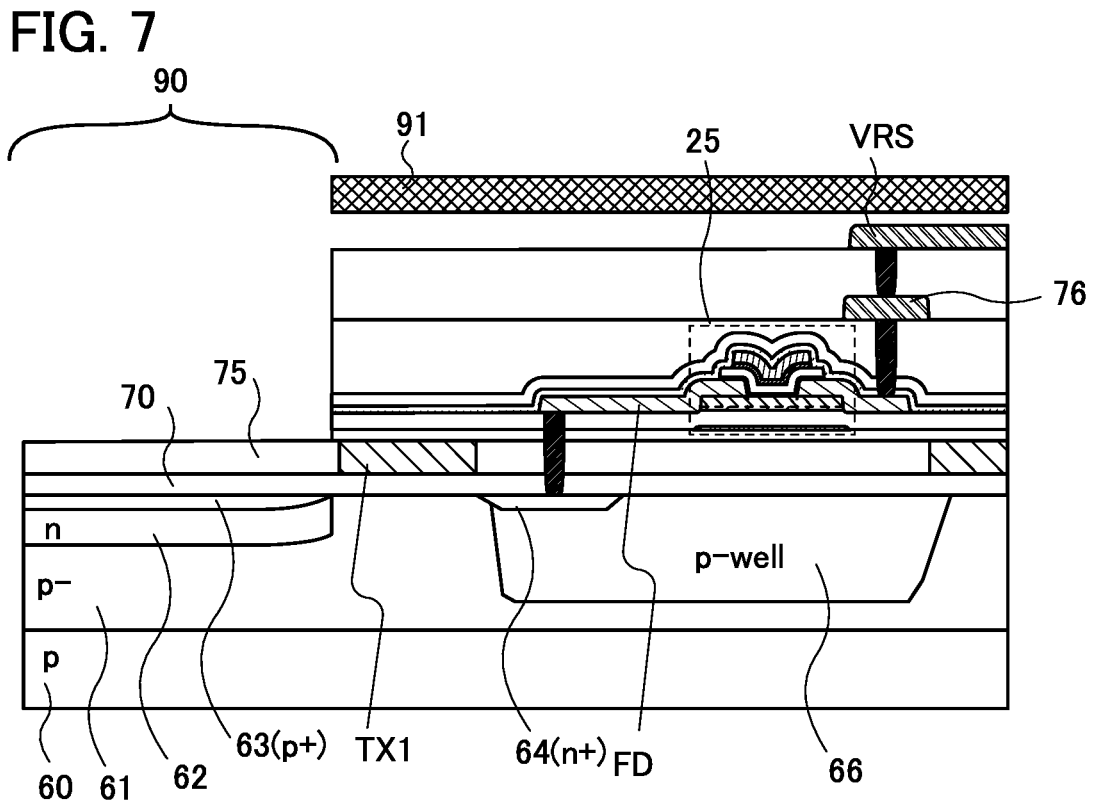
FIG. 7 is a cross-sectional view of a solid-state imaging element illustrating one embodiment of the present invention.

In FIG. 6B, the transistor using an oxide semiconductor is not placed; thus, FIG. 7 illustrates an example of a cross-sectional structure in which the transistor 25 using an oxide semiconductor is arranged and which partially corresponds to FIG. 6B. The insulating layers used in FIG. 7 are the same as those used in FIG. 6B, and the same portions are described with the same reference numerals.

In FIG. 6A and FIG. 6B, polysilicon wirings or metal wirings are used for the first pair of transfer gates 71, the second pair of transfer gates 72, the third pair of transfer gates 73, and the fourth pair of transfer gates 74.

By applying voltages to the first pair of transfer gates 71, the second pair of transfer gates 72, the third pair of transfer gates 73, and the fourth pair of transfer gates 74, high-speed transfer to the charge-accumulation regions 64 of photoelectrons generated in the light-receiving region 90 is assisted.

The reset transistor can function as a reset transistor for initializing the potential of the light-receiving region 90. By applying a voltage to the wiring TX4 serving as a gate of the reset transistor, charges are transferred at high speed to the charge-draining region 65 and the charges are drained for reset. Note that the transistor whose gate is the wiring TX4 is manufactured in a known CMOS manufacturing process. In addition, transistors whose gates are the wirings TX1, TX2, and TX3 are also manufactured in a known CMOS manufacturing process. In this embodiment, the structure in which one pixel includes three charge-accumulation regions 64 and one charge-draining region 65 is illustrated, but there is no particular limitations and a plurality of charge-draining regions may be provided. The charge-accumulation regions 64 and the charge-draining region 65 are n+ regions that are formed in the same process and the charge-draining region is connected to the reset transistor; they are named differently just to be distinguished.

In FIG. 7, the transistor whose gate is the wiring TX1 is illustrated among transistors embedded in the silicon wafer, and the charge-accumulation region 64 serves as a source region or a drain region. In addition, the transistor whose gate is the wiring TX1 is electrically connected to one of a source electrode and a drain electrode of the transistor 25 using an oxide semiconductor and the one of the source electrode and the drain electrode of the transistor 25 serves as the storage node FD and the other thereof is electrically connected to the wiring VRS through a connection electrode 76. Furthermore, the transistor 25 using an oxide semiconductor partly overlaps with the charge-accumulation region 64. The transistor using an oxide semiconductor layer is stacked over the charge-accumulation region to be partly overlapped, so that the circuit area can be reduced to downsize the chip.

The solid-state imaging element described in this embodiment has three charge-transfer transistors, and has three storage nodes for charge accumulation, which is an element corresponding to the circuit illustrated in FIG. 2 in Embodiment 1.

Although the transistor 25 includes a back gate in the example illustrated in FIG. 7, a mode without the back gate may be employed. The back gate may be electrically connected to a front gate provided opposite to the back gate of the transistor. Alternatively, a fixed potential different from the front gate might be supplied to the back gate.

A transistor whose active layer is formed using an oxide semiconductor (hereinafter referred to as an OS transistor) can be used as the transistor 25.

Extremely low off-state current of the OS transistor can widen the dynamic range of imaging.

A period during which charge can be held in the charge-accumulation region 64 can be extremely long owing to the low off-state current of the transistor 25. In addition, leakage can be reduced.

The OS transistor has lower temperature dependence of electrical characteristic variations than a transistor using silicon in an active region or an active layer (hereinafter referred to as a Si transistor), and thus can be used in an extremely wide range of temperatures. Accordingly, a solid-state imaging element and a semiconductor device that include OS transistors are suitable for use in automobiles, aircraft, spacecraft, and the like.

Embodiment 4

In this embodiment, a transistor including oxide semiconductor that can be used in one embodiment of the present invention will be described with reference to drawings. Note that in the drawings in this embodiment, some components are enlarged, reduced in size, or omitted for clarification.

Figure 8A:
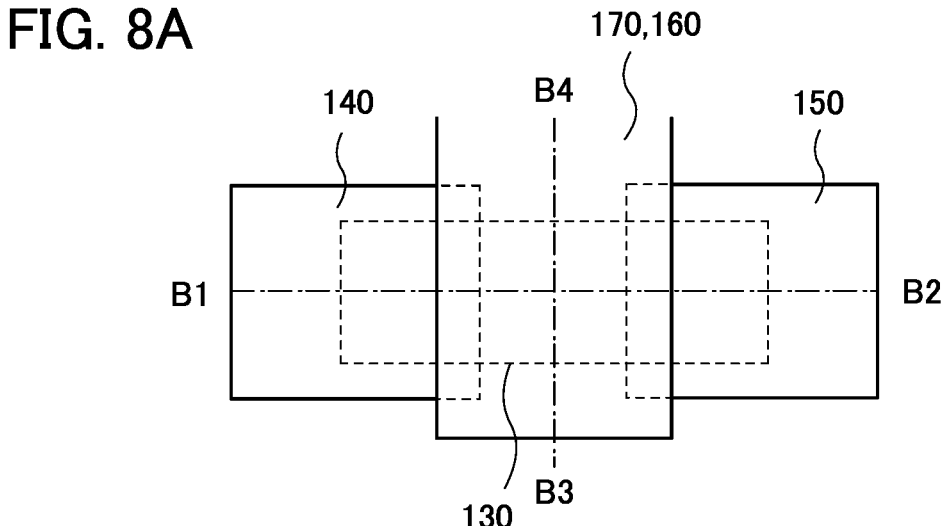
FIG. 8A and FIG. 8B are a top view and a cross-sectional view, respectively, illustrating a transistor used in a solid-state imaging element illustrating one embodiment of the present invention.
Figure 8B:
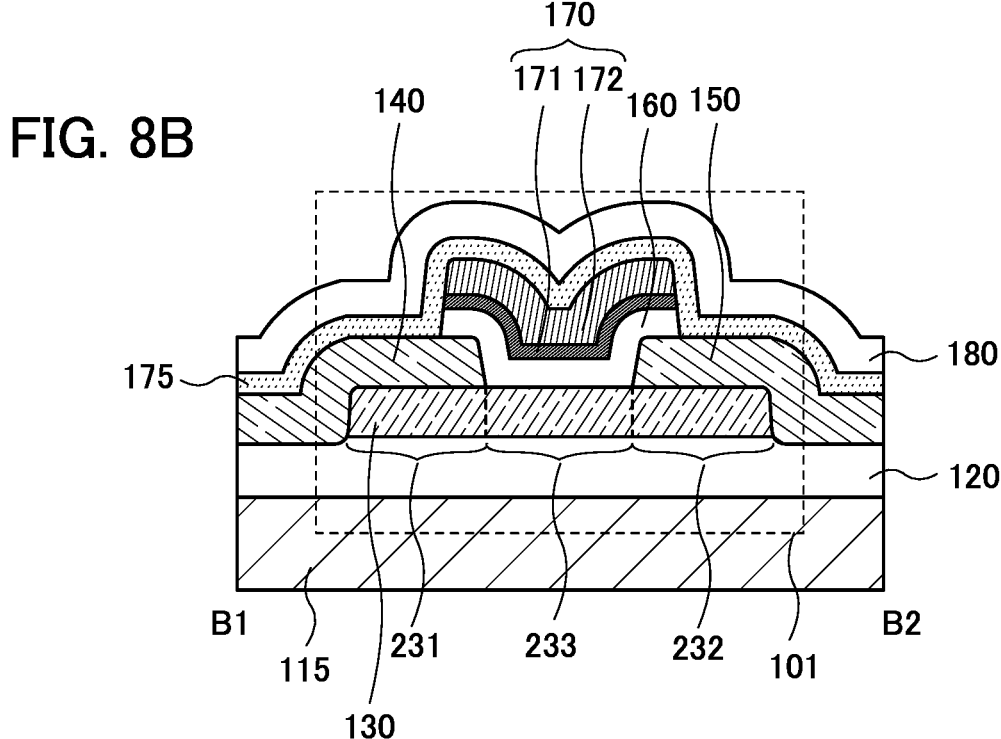

FIG. 8A and FIG. 8B are a top view and a cross-sectional view of a transistor used for a solid-state imaging element of one embodiment of the present invention. FIG. 8A is a top view, and FIG. 8B corresponds to a cross section taken along a dashed-dotted line B1-B2 in FIG. 8A. FIG. 9A corresponds to a cross section taken along a dashed-dotted line B3-B4 in FIG. 8A. Furthermore, the direction of the dashed-dotted line B1-B2 and the direction of the dashed-dotted line B3-B4 are referred to as a channel length direction and a channel width direction, respectively, in some cases. FIG. 9B is a top view of the oxide semiconductor layer 130 of the transistor, and FIG. 9C corresponds to a cross section taken along a dashed-dotted line A1-A2 in FIG. 9B, and FIG. 9D corresponds to a cross section taken along a dashed-dotted line A3-A4 in FIG. 9B.

The transistor 101 includes an insulating layer 120 in contact with a substrate 115; an oxide semiconductor layer 130 in contact with the insulating layer 120; a conductive layer 140 and a conductive layer 150 electrically connected to the oxide semiconductor layer 130; an insulating layer 160 in contact with the oxide semiconductor layer 130, the conductive layer 140, and the conductive layer 150; a conductive layer 170 in contact with the insulating layer 160; an insulating layer 175 in contact with the conductive layer 140, the conductive layer 150, the insulating layer 160, and the conductive layer 170; and an insulating layer 180 in contact with the insulating layer 175. The insulating layer 180 may function as a planarization film as necessary.

Here, the conductive layer 140 can function as a source electrode layer, the conductive layer 150 can function as a drain electrode layer, the insulating layer 160 can function as a gate insulating film, and the conductive layer 170 can function as a gate electrode layer.

For the substrate 115, a semiconductor substrate can be used, and for example, a silicon substrate in which a transistor having single crystal silicon in a channel formation region is formed, and a substrate in which an insulating layer, a wiring, a conductor functioning as a contact plug, and the like that are provided over the silicon substrate can be used.

The insulating layer 120 can play a role in supplying oxygen to the oxide semiconductor layer 130 as well as having a role in preventing diffusion of impurities from a component of the substrate 115. Therefore, the insulating layer 120 preferably is an insulating film containing oxygen and more preferably is an insulating film containing oxygen more than that in the stoichiometric composition. The insulating layer 120 is, for example, a film in which the amount of released oxygen when converted into oxygen atoms is greater than or equal to $1.0 \times 10^{19}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C. Furthermore, when the substrate 115 is a substrate provided with another device as described above, the insulating layer 120 also has a function of an interlayer insulating film. In that case, planarization treatment by a CMP (Chemical Mechanical Polishing) method or the like is preferably performed so as to make a flat surface.

For the insulating layer 120, an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a mixed material of any of these can be used, for example. It is also possible to use the a stack of any of the above materials.

In this embodiment, detailed description is given mainly on the case where the oxide semiconductor layer 130 of the transistor has a three-layer structure in which the oxide semiconductor layer 130a, the oxide semiconductor layer 130b, and the oxide semiconductor layer 130c are sequentially stacked from the insulating layer 120 side.

Note that when the oxide semiconductor layer 130 is a single layer, a layer corresponding to the oxide semiconductor layer 130b described in this embodiment may be used.

In the case where the oxide semiconductor layer 130 includes two layers, a stack in which a layer corresponding to the oxide semiconductor layer 130a and a layer corresponding to the oxide semiconductor layer 130b described in this embodiment are stacked in this order from the insulating layer 120 side may be used. In the case of this structure, the oxide semiconductor layer 130a and the oxide semiconductor layer 130b can be interchanged.

In the case where the oxide semiconductor layer 130 has four or more layers, for example, a structure in which another oxide semiconductor layer is added to the three-layer stack of the oxide semiconductor layer 130 described in this embodiment can be employed.

For the oxide semiconductor layer 130b, an oxide semiconductor whose electron affinity (energy from the vacuum level to the conduction band minimum) is higher than those of the oxide semiconductor layer 130a and the oxide semiconductor layer 130c is used, for example. The electron affinity is a value that can be obtained by subtracting an energy difference between the conduction band minimum and the valence band maximum (an energy gap) from an energy difference between the vacuum level and the valence band maximum (an ionization potential).

It is preferable that each of the oxide semiconductor layer 130a and the oxide semiconductor layer 130c contain one or more kinds of metal elements forming the oxide semiconductor layer 130b, and be formed using an oxide semiconductor whose energy of the conduction band minimum is closer to the vacuum level than that of the oxide semiconductor layer 130b, for example, by any of 0.05 eV or more, 0.07 eV or more, 0.1 eV or more, and 0.15 eV or more and any of 2 eV or less, 1 eV or less, 0.5 eV or less, and 0.4 eV or less.

With such a structure, when an electric field is applied to the conductive layer 170, a channel is formed in the oxide semiconductor layer 130b whose energy at the conduction band minimum is the lowest in the oxide semiconductor layer 130.

Furthermore, since the oxide semiconductor layer 130a contains one or more kinds of metal elements contained in the oxide semiconductor layer 130b, an interface state is unlikely to be formed at the interface between the oxide semiconductor layer 130a and the oxide semiconductor layer 130b, compared with the interface in the case where the oxide semiconductor layer 130b is in contact with the insulating layer 120. The interface state sometimes forms a channel; therefore, the threshold voltage of the transistor is changed in some cases. Thus, providing the oxide semiconductor layer 130a can reduce variation in electrical characteristics of the transistor, such as a threshold voltage. The reliability of the transistor can be improved.

Since the oxide semiconductor layer 130c contains one or more kinds of metal elements contained in the oxide semiconductor layer 130b, scattering of carriers is unlikely to occur at the interface between the oxide semiconductor layer 130b and the oxide semiconductor layer 130c, compared with the interface in the case where the oxide semiconductor layer 130b is in contact with the gate insulating film (the insulating layer 160). Therefore, providing the oxide semiconductor layer 130c can increase the field-effect mobility of the transistor.

For the oxide semiconductor layer 130a and the oxide semiconductor layer 130c, for example, a material containing Al, Ti, Ga, Ge, Y, Zr, Sn, La, Ce, or Hf with a higher atomic ratio than that used for the oxide semiconductor layer 130b can be used. Specifically, the atomic ratio is 1.5 times or more, preferably 2 times or more, further preferably 3 times or more as large as that in the oxide semiconductor layer 130b. The above element is strongly bonded to oxygen, and thus has a function of suppressing generation of oxygen vacancies in the oxide semiconductor layer. That is, an oxygen vacancy is less likely to be generated in the oxide semiconductor layer 130a and the oxide semiconductor layer 130c than in the oxide semiconductor layer 130b.

An oxide semiconductor that can be used for the oxide semiconductor layer 130a, the oxide semiconductor layer 130b, and the oxide semiconductor layer 130c preferably contains at least indium (In) or zinc (Zn). Alternatively, both In and Zn are preferably contained. In order to reduce variations in electrical characteristics of the transistor using the oxide semiconductor, a stabilizer is preferably contained in addition to them.

Examples of a stabilizer include gallium (Ga), tin (Sn), hafnium (Hf), aluminum (Al), and zirconium (Zr). Other examples of the stabilizer include lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

Examples of the oxide semiconductor that can be used include indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, an Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—AL—Zn oxide.

Note that, for example, an In—Ga—Zn oxide means an oxide containing In, Ga, and Zn as its main components. Furthermore, a metal element other than In, Ga, and Zn may be contained. In this specification, a film formed with an In—Ga—Zn oxide is also referred to as an IGZO film.

A material represented by $InMO_3(ZnO)_m$ (m>0, and m is not an integer) may be used. Note that M represents one or more metal elements selected from Ga, Y, Zr, La, Ce, and Nd. A material represented by $In_2SnO_5(ZnO)_n$ (n>0, n is an integer) may be used.

Note that when each of the oxide semiconductor layer 130a, the oxide semiconductor layer 130b, and the oxide semiconductor layer 130c is an In-M-Zn oxide containing at least indium, zinc, and M (M is a metal such as Al, Ti, Ga, Ge, Y, Zr, Sn, La, Ce, or Hf), and the oxide semiconductor layer 130a has an atomic ratio of In:M:Zn=$x_1$:$y_1$:$z_1$, the oxide semiconductor layer 130b has an atomic ratio of In:M:Zn=$x_2$:$y_2$:$z_2$, and the oxide semiconductor layer 130c has an atomic ratio of In:M:Zn=$x_3$:$y_3$:$z_3$, each of $y_1/x_1$ and $y_3/x_3$ is preferably larger than $y_2/x_2$. Each of $y_1/x_1$ and $y_3/x_3$ is one and a half times or more as large as $y_2/x_2$, preferably twice or more as large as $y_2/x_2$, more preferably three times or more as large as $y_2/x_2$. At this time, when $y_2$ is greater than or equal to $x_2$ in the oxide semiconductor layer 130b, a transistor can have stable electrical characteristics. However, when is three times or more as great as $x_2$, the field-effect mobility of the transistor is reduced; accordingly, is preferably less than three times $x_2$.

As for the atomic proportions of In and M, excluding Zn and O, in the oxide semiconductor layer 130a and the oxide semiconductor layer 130c, preferably, the proportion of In is lower than 50 atomic % and the proportion of M is higher than or equal to 50 atomic %, further preferably, the proportion of In be lower than 25 atomic % and the proportion of M is higher than or equal to 75 atomic %. As for the atomic proportions of In and M, excluding Zn and O, in the oxide semiconductor layer 130b, the proportion of In is higher than or equal to 25 atomic % and the proportion of M is lower than 75 atomic %, further preferably, the proportion of In is higher than or equal to 34 atomic % and the proportion of M is lower than 66 atomic %.

The indium content in the oxide semiconductor layer 130b is preferably higher than those in the oxide semiconductor layer 130a and the oxide semiconductor layer 130c. In an oxide semiconductor, the s orbital of heavy metal mainly contributes to carrier transfer, and when the proportion of In in the oxide semiconductor is increased, more s orbitals overlap with each other. Therefore, an oxide having a composition in which the In content is higher than the M content has higher mobility than an oxide having a composition in which the In content is equal to or lower than the M content. Thus, with use of an oxide having a high indium content for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, further preferably greater than or equal to 5 nm and less than or equal to 25 nm. The thickness of the oxide semiconductor layer 130b is greater than or equal to 3 nm and less than or equal to 200 nm, preferably greater than or equal to 10 nm and less than or equal to 150 nm, further preferably greater than or equal to 15 nm and less than or equal to 100 nm. The thickness of the oxide semiconductor layer 130c is greater than or equal to 1 nm and less than or equal to 50 nm, preferably greater than or equal to 2 nm and less than or equal to 30 nm, further preferably greater than or equal to 3 nm and less than or equal to 15 nm. In addition, the oxide semiconductor layer 130b is preferably thicker than the oxide semiconductor layer 130a and the oxide semiconductor layer 130c.

In order to give stable electrical characteristics to a transistor in which a channel is formed in the oxide semiconductor layer, it is effective to make the oxide semiconductor layer intrinsic or substantially intrinsic by reducing the concentration of impurities in the oxide semiconductor layer. The term substantially intrinsic refers to the state where an oxide semiconductor layer has a carrier density lower than $1\times10^{17}/cm^3$, preferably lower than $1\times10^{15}/cm^3$, further preferably lower than $1\times10^{13}/cm^3$.

Further, in the oxide semiconductor layer, hydrogen, nitrogen, carbon, silicon, and a metal element other than main components are impurities. For example, hydrogen and nitrogen contribute to formation of donor states, thereby increasing the carrier density. Silicon contributes to formation of impurity states in an oxide semiconductor layer. The impurity state becomes a trap, which might deteriorate the electric characteristics of the transistor. Therefore, it is preferable to reduce the impurity concentrations in the oxide semiconductor layer 130a, the oxide semiconductor layer 130b, and the oxide semiconductor layer 130c, and the impurity concentrations at interfaces thereof.

In order that the oxide semiconductor layer can be intrinsic or substantially intrinsic, the concentration of silicon measured by SIMS (secondary ion mass spectrometry) analysis is lower than $1\times10^{19}$ atoms/cm$^3$, preferably lower than $5\times10^{18}$ atoms/cm$^3$ and higher than or equal to $1\times10^{18}$ atoms/cm$^3$, at a certain depth of the oxide semiconductor layer or a region of the oxide semiconductor layer. Furthermore, the concentration of hydrogen at a certain depth of the oxide semiconductor layer or in a certain region of the oxide semiconductor layer is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$ and higher than or equal to $1\times10^{17}$ atoms/cm$^3$. Moreover, the concentration of nitrogen at a certain depth of the oxide semiconductor layer or in a certain region of the oxide semiconductor layer is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ and higher than or equal to $5\times10^{16}$ atoms/cm$^3$.

In addition, in the case where the oxide semiconductor layer includes a crystal, the crystallinity of the oxide semiconductor layer might be decreased if silicon or carbon is included at high concentration. In order not to reduce the crystallinity of the oxide semiconductor layer, for example, the concentration of silicon in a part of at a certain depth of the oxide semiconductor layer or in a region of the oxide semiconductor layer is lower than $1\times10^{19}$ atoms/cm$^3$, preferably lower than $5\times10^{18}$ atoms/cm$^3$ and higher than or equal to $1\times10^{18}$ atoms/cm$^3$. Furthermore, the concentration of carbon in a part at a certain depth of the oxide semiconductor layer or in a certain region of the oxide semiconductor layer is lower than $1\times10^{19}$ atoms/cm$^3$, preferably lower than $5\times10^{18}$ atoms/cm$^3$, further preferably lower than $1\times10^{18}$ atoms/cm$^3$ and higher than or equal to $6\times10^{17}$ atoms/cm$^3$, for example.

In addition, the off-state current of a transistor in which the above highly purified oxide semiconductor layer is used for a channel formation region is extremely low. When a voltage between a source and a drain is set to approximately 0.1 V, 5 V, or 10 V, for example, the off-state current normalized with channel width of the transistor can be as low as several yoctoamperes per micrometer to several zeptoamperes per micrometer.

For the oxide semiconductor layer 130a and the oxide semiconductor layer 130c, an In—Ga—Zn oxide or the like with In:Ga:Zn=1:3:2, 1:3:3, 1:3:4, 1:3:6, 1:4:5, 1:6:4, or 1:9:6 (atomic ratio) or the like can be used, for example. An In—Ga—Zn oxide or the like whose atomic ratio of In to Ga and Zn is 1:1:1, 2:1:3, 5:5:6, 3:1:2, or the like can be used for the oxide semiconductor layer 130b. The atomic ratio in each of the oxide semiconductor layer 130a, the oxide semiconductor layer 130b, and the oxide semiconductor layer 130c includes a variation within a range of ±20% as a margin.

The region 231, the region 232, and the region 233 in FIG. 8B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layer 140 and the conductive layer 150, for example, the resistance of the region 231 and the region 232 can be reduced.

Specifically, since the oxide semiconductor layer 130 is in contact with the conductive layer 140 and the conductive layer 150, oxygen vacancies are generated in the oxide semiconductor layer 130, and owing to interaction between the oxygen vacancies and hydrogen that remains in the oxide semiconductor layer 130 or diffuses into the oxide semiconductor layer 130 from the outside, the region 231 and the region 232 become n-type low-resistance regions.

For the conductive layer 140 functioning as a source electrode layer and the conductive layer 150 functioning as a drain electrode layer, a single layer or a stacked layer using a material selected from Al, Cr, Cu, Ta, Ti, Mo, W, Ni, Mn, Nd, and Sc and alloys of any of the metal materials can be used, for example. Typically, it is preferable to use specifically Ti, which is easily bonded to oxygen, or W, which has a high melting point and thus allows subsequent process temperatures to be relatively high. It is also possible to use a stack of any of the above materials and low-resistance Cu or an alloy such as Cu—Mn.

The above materials have the property of extracting oxygen from an oxide semiconductor layer. Thus, in part of a region of the oxide semiconductor layer that is in contact with any of the above materials, oxygen is released from the oxide semiconductor layer and an oxygen vacancy is formed. When hydrogen slightly contained in the film and the oxygen vacancy are bonded to each other, the region considerably changes into an n-type region. Accordingly, the n-type region can function as a source or a drain of a transistor.

In the case where W is used for the conductive layer 140 and the conductive layer 150, nitrogen-doping may be performed. Nitrogen-doping can appropriately lower the capability of extracting oxygen and prevent the n-type region from spreading to a channel formation region.

It is possible to prevent the n-type region from spreading to a channel formation region, also when the conductive layer 140 and the conductive layer 150 each have a stack with an n-type semiconductor layer and the n-type semiconductor layer is in contact with the oxide semiconductor layer. As the n-type semiconductor layer, an In—Ga—Zn oxide, zinc oxide, indium oxide, tin oxide, indium tin oxide, or the like to which nitrogen is added can be used.

Note that functions of a "source" and a "drain" of a transistor may be switched in the case where transistors of different polarities are employed or in the case where the direction of a current flow changes in a circuit operation. Therefore, the terms "source" and "drain" are interchangeable for use in this specification. In addition, "electrode layer" can be rephrased as "wiring".

The conductive layer 170 includes two layers, a conductive layer 171 and a conductive layer 172 in the illustrated example, but also may be a single layer or a stack of three or more layers.

Each of the conductive layer 140 and the conductive layer 150 is a single layer in the illustrated example, but also may be a stack of two or more layers.

For the insulating layer 160 functioning as a gate insulating film, an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide can be used. Furthermore, the insulating layer 160 may be a stack including any of the above materials. The insulating layer 160 may contain lanthanum (La), nitrogen, or zirconium (Zr) as an impurity.

An example of a stacked-layer structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the thickness of the insulating layer 160 can be made large as compared with the case of using silicon oxide; thus, leakage current due to tunnel current can be low. That is, it is possible to achieve a transistor with a low off-state current. Moreover, hafnium oxide having a crystal structure has a higher dielectric constant than hafnium oxide having an amorphous structure. Therefore, it is preferable to use hafnium oxide having a crystal structure, in order to obtain a transistor with a low off-state current. Examples of the crystal structure include a monoclinic crystal structure and a cubic crystal structure. However, one embodiment of the present invention is not limited thereto.

Furthermore, for the insulating layer 120 and the insulating layer 160 in contact with the oxide semiconductor layer 130, a film that releases a smaller amount of nitrogen oxide is preferably used. When an oxide semiconductor is in contact with an insulating layer that releases a large amount of nitrogen oxide, the density of states caused by nitrogen oxide becomes high in some cases. The density of states due to nitrogen oxide can be formed in the energy gap of the oxide semiconductor. For the insulating layer 120 and the insulating layer 160, for example, an oxide insulating layer such as a silicon oxynitride film or an aluminum oxynitride film that releases a smaller amount of nitrogen oxide can be used.

Note that a silicon oxynitride film that releases a smaller amount of nitrogen oxide is a film of which the amount of released ammonia is larger than the amount of released nitrogen oxide in TDS; the amount of released ammonia is typically greater than or equal to $1 \times 10^{18}/cm^3$ and less than or equal to $5 \times 10^{19}/cm^3$. Note that the amount of released ammonia is the amount of ammonia released by heat treatment in which the surface temperature of a film becomes higher than or equal to 50° C. and lower than or equal to 650° C., preferably higher than or equal to 50° C. and lower than or equal to 550° C.

By using the above oxide insulating layers for the insulating layer 120 and the insulating layer 160, a shift in the threshold voltage of the transistor can be reduced, and fluctuations in the electrical characteristics of the transistor can be reduced.

As the conductive layer 170 functioning as a gate electrode layer, a conductive film of Al, Ti, Cr, Co, Ni, Cu, Y, Zr, Mo, Ru, Ag, Mn, Nd, Sc, Ta, W, or the like can be used, for example. It is also possible to use alloys of the above materials or conductive nitrides of the above materials. It is also possible to use a stack including a plurality of materials selected from the above materials, alloys of the above materials, and conductive nitrides of the above materials. Typically, tungsten, a stack of tungsten and titanium nitride, a stack of tungsten and tantalum nitride, or the like can be used. Low-resistance Cu or an alloy such as Cu—Mn, or a stack of any of the above materials and Cu or an alloy such as Cu—Mn may also be used. In this embodiment, tantalum nitride can be used for the conductive layer 171 and tungsten can be used for the conductive layer 172 to form the conductive layer 170.

As the insulating layer 175, a silicon nitride film, an aluminum nitride film, or the like containing hydrogen can be used. A nitride insulating film also has a function of blocking moisture and the like and thus can improve the reliability of the transistor.

An aluminum oxide film can also be used as the insulating layer 175. Furthermore, an aluminum oxide film has a high blocking effect that prevents both oxygen and impurities such as hydrogen and moisture from penetrating the film. Accordingly, the aluminum oxide film is suitable as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120, during and after the manufacturing process of the transistor. Furthermore, oxygen contained in the aluminum oxide film can be diffused into the oxide semiconductor layer.

Furthermore, the insulating layer 180 is preferably formed over the insulating layer 175. For the insulating layer, an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide can be used. Furthermore, the insulating layer may be a stack including any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. Thus, stable electrical characteristics of the transistor can be obtained.

High integration of a semiconductor device requires transistor miniaturization. However, it is known that miniaturization of a transistor causes deterioration of electrical characteristics of the transistor. In particular, miniaturization in channel width causes a great reduction in on-state current.

In the transistor of one embodiment of the present invention, as described above, the gate electrode layer (the conductive layer 170) is formed to electrically surround the oxide semiconductor layer 130 in the channel width direction; thus, a gate electric field from a side surface as well as a gate electric field in a vertical direction is applied to the oxide semiconductor layer 130. In other words, the gate electric fields are applied to the channel formation layer entirely and an effective channel width is increased, leading to a further increase in the on-state current.

Furthermore, in the transistor in one embodiment of the present invention in which the oxide semiconductor layer 130 has a two-layer structure or a three-layer structure, since the oxide semiconductor layer 130b where a channel is formed is provided over the oxide semiconductor layer 130a, an interface state is less likely to be formed. In the transistor in one embodiment of the present invention in which the oxide semiconductor layer 130 has a three-layer structure, since the oxide semiconductor layer 130b is positioned at the middle of the three-layer structure, the influence of an impurity entering from above and below can also be eliminated. Therefore, the transistor can achieve not only the increase in the on-state current described above but also stabilization of the threshold voltage and a reduction in the S value (subthreshold value). Accordingly, power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is suppressed.

Although the variety of films such as the metal films, the semiconductor films, and the inorganic insulating films described in this embodiment can be formed typically by a sputtering method or a plasma-enhanced CVD method, such films may be formed by another method, e.g., a thermal CVD method. As examples of a thermal CVD method, an MOCVD (metal organic chemical vapor deposition) method, an ALD (atomic layer deposition) method, and the like are given.

A thermal CVD method, which is a deposition method not using plasma, has an advantage that no defect due to plasma damage is generated.

Moreover, deposition by a thermal CVD method may be performed in such a manner that a source gas and an oxidizer are supplied to a chamber at a time, the inside of the chamber is set to an atmospheric pressure or a reduced pressure, and reaction is caused in the vicinity of the substrate or over the substrate so as to deposit a film over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (argon, nitrogen, or the like) or the like is introduced at the same time as or after the introduction of a first source gas and then a second source gas is introduced. Note that in the case where the introduction of the inert gas is performed at the same time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of the substrate to form a first layer; the second source gas is then introduced to react with the first layer; as a result, a second layer is stacked over the first layer, so that a thin film is formed. The sequence of the gas introduction is controlled and repeated a plurality of times until a desired thickness is obtained, whereby a thin film with excellent step coverage can be formed. The thickness of the thin film can be adjusted, depending on the number of repetition times of the sequence of the gas introduction; therefore, an ALD method makes it possible to accurately adjust a thickness and is thus suitable for manufacturing a minute FET.

A variety of films such as the metal film, the semiconductor film, and the inorganic insulating film disclosed in the above-described embodiments can be formed by a thermal CVD method such as a MOCVD method or an ALD method; for example, in the case of forming an In—Ga—Zn—O film, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using ALD, two kinds of gases, ozone ($O_3$) as an oxidizer and a source gas which is obtained by vaporizing liquid containing a solvent and a hafnium precursor compound (a hafnium alkoxide solution or hafnium amide such as tetrakis(dimethylamide)hafnium (TDMAH)), are used. Note that the chemical formula of tetrakis dimethylamide hafnium is $Hf[N(CH_3)_2]_4$. Furthermore, examples of another material liquid include tetrakis (ethylmethylamide)hafnium.

For example, in the case where an aluminum oxide film is formed with a deposition apparatus using ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptane-dionate).

For example, in the case where a silicon oxide film is formed by a deposition apparatus using ALD, hexachloro-disilane is adsorbed on a deposition surface, chlorine contained in the adsorbate is removed, and radicals of an oxidizing gas (e.g., $O_2$ or dinitrogen monoxide) are supplied to react with the adsorbate.

For example, in the case where a tungsten film is formed by a deposition apparatus using ALD, a $WF_6$ gas and a $B_2H_6$ gas are sequentially and repeatedly introduced to form an initial tungsten film, and then a $WF_6$ gas and an $H_2$ gas are sequentially and repeatedly introduced to form a tungsten film. Note that an $SiH_4$ gas may be used instead of a $B_2H_6$ gas.

For example, in the case where an oxide semiconductor film, for example, an In—Ga—Zn—O film, is formed by a deposition apparatus using ALD, an $In(CH_3)_3$ gas and an $O_3$ gas are sequentially and repeatedly introduced to form an In—O layer, a $Ga(CH_3)_3$ gas and an $O_3$ gas are sequentially and repeatedly introduced to form a GaO layer, and then a $Zn(CH_3)_2$ gas and an $O_3$ gas are sequentially and repeatedly introduced to form a ZnO layer. Note that the order of these layers is not limited to this example. Furthermore, a mixed compound layer such as an In—Ga—O layer, an In—Zn—O layer, or a Ga—Zn—O layer may be formed by mixing these gases. Note that although an $H_2O$ gas which is obtained by bubbling water with an inert gas such as Ar may be used instead of an $O_3$ gas, it is preferable to use an $O_3$ gas not containing H. Furthermore, instead of an $In(CH_3)_3$ gas, an $In(C_2H_5)_3$ gas may be used. Furthermore, instead of a $Ga(CH_3)_3$ gas, a $Ga(C_2H_5)_3$ gas may be used. Furthermore, a $Zn(CH_3)_2$ gas may be used.

The structure described in this embodiment can be used in an appropriate combination with any pf the structures described in the other embodiments.

Embodiment 5

Figure 1:
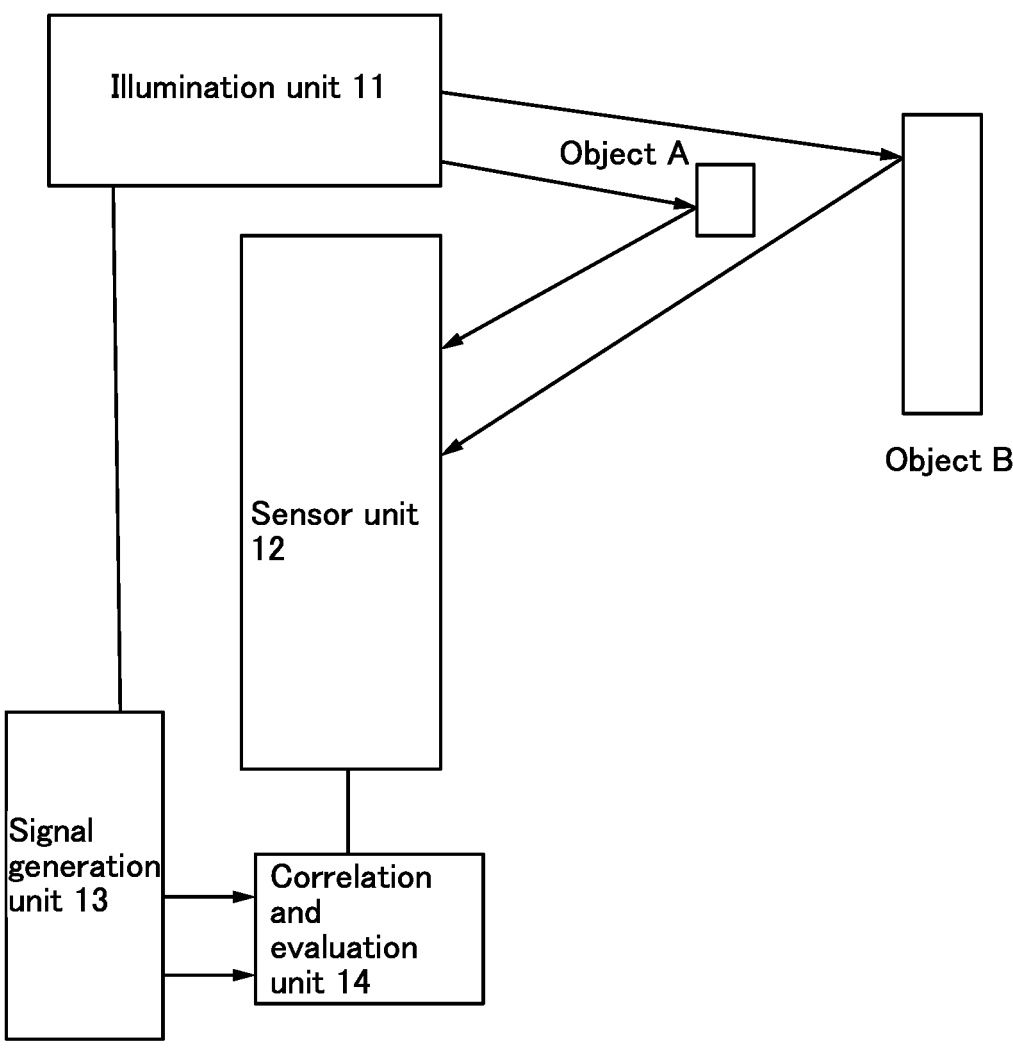
FIG. 1 is a schematic view illustrating one embodiment of the present invention.

In this embodiment, an example of a combination of an AI (Artificial Intelligence) system and a TOF camera illustrated in FIG. 1 is described with reference to FIG. 10, FIG. 11 and FIG. 12.

Figure 10A:
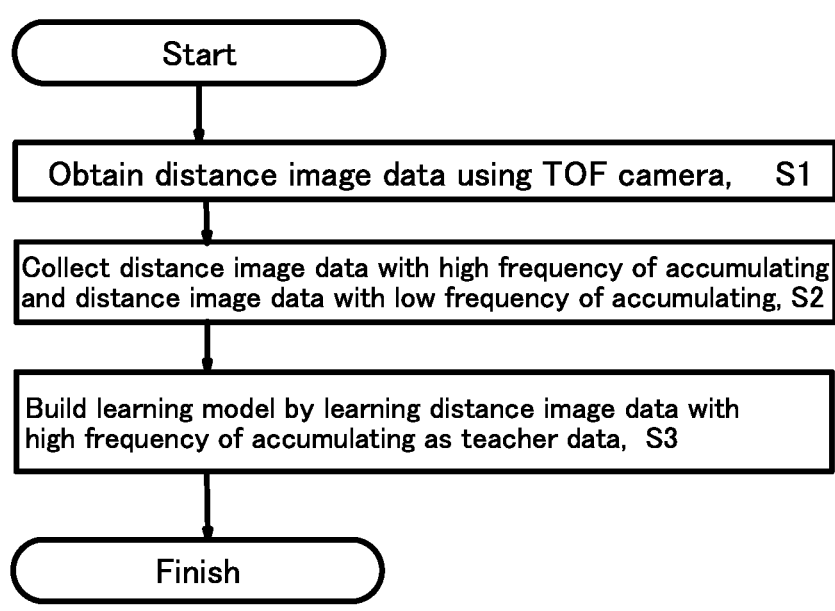
FIG. 10A and FIG. 10B are examples of flow charts illustrating one embodiment of the present invention.

FIG. 10A illustrates an example of a flowchart in which a learning model is built in a distance estimation device, specifically, an estimation portion.

First, in order to obtain teacher data, distance image data is obtained using a TOF camera. (Step 1: S1)

Then, distance image data with a high frequency of accumulating and distance image data with a low frequency of accumulating are collected. (Step 2: S2)

Then, distance image data with a high frequency of accumulating is learned as teacher data and the learning model is built in the estimation portion. (Step 3: S3)

Figure 10B:
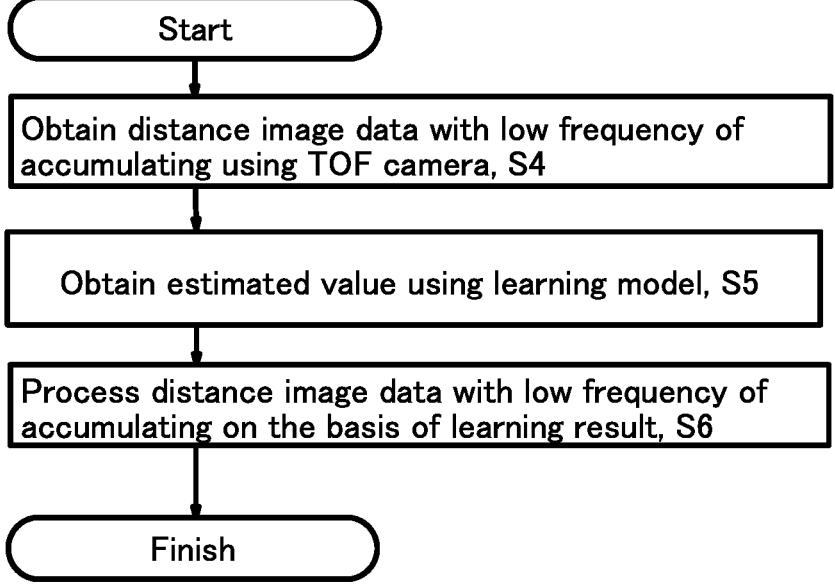

In a state that the learning mode learned in the flowchart illustrated in FIG. 10A is built in the estimation model in advance, desired distance image data is obtained in accordance with a flow in FIG. 10B.

First, the distance image data with a low frequency of accumulating is obtained with use of the TOF camera. (Step 4: S4)

Then, an estimated value is obtained using the learning model built in advance. (Step 5: S5) Specifically, a probability for every distance level (also referred to as measurement section) of each pixel of the pixels of input image data is generated. For example, a probability map for each of a plurality of distance levels can be formed, like that the probability of greater than or equal to 1 m and less than 45 m is 20%, the probability of greater than or equal to 45 m and less than 90 m is 70%, and the probability of greater than or equal to 90 m and less than 135 m is 10%.

Lastly, the distance image data with a low frequency of accumulating is processed on the basis of the learning result. (Step 6: S6) As an output result, data with a high probability is selected and finally, distance image data that is equivalent to or better than the distance image data with a high frequency of accumulating can be obtained.

Figure 11:
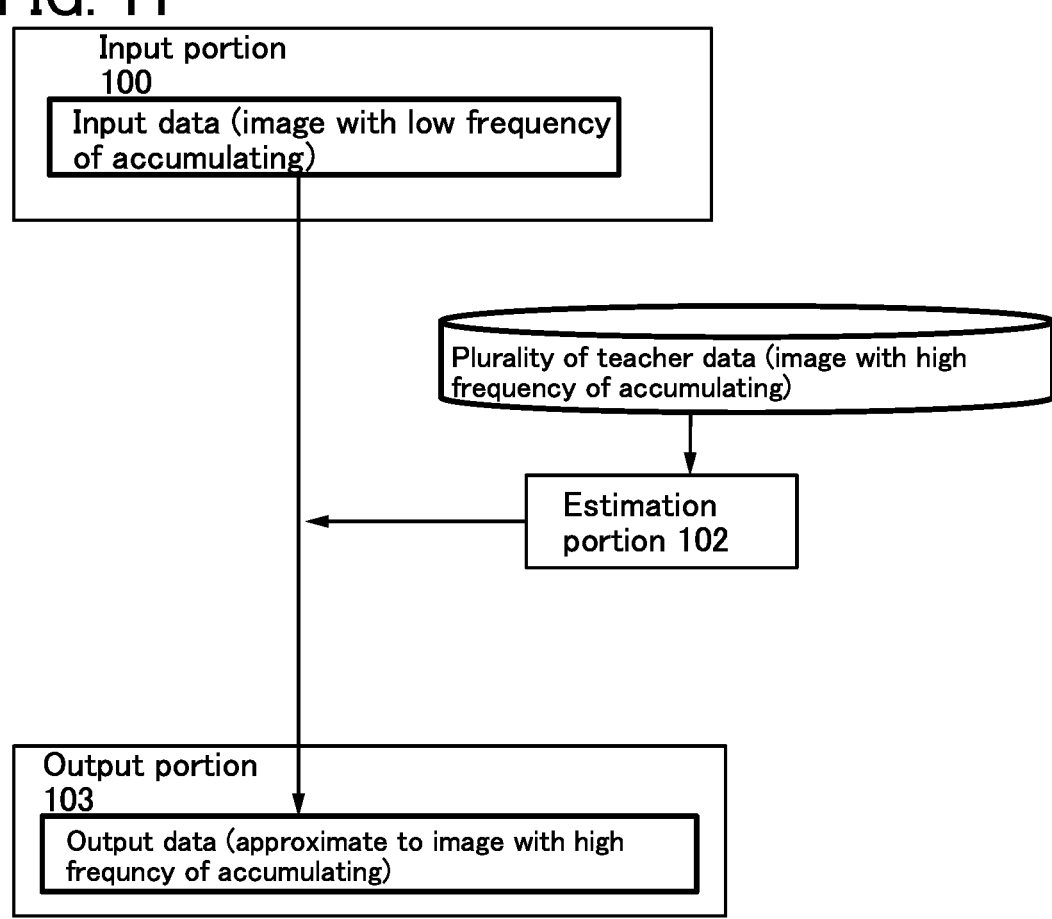
FIG. 11 is a block diagram illustrating one embodiment of the present invention.

A processing procedure of the data in Step 6 is illustrated in a block diagram of FIG. 11.

A conventional TOF camera repeats measurements many times, and performs accumulating and averaging processing to improve the resolution in some cases. In other words, the frequency of accumulating is increased and averaging is performed for denoising. In this embodiment, data of charge amount accumulated for every light-receiving period on the basis of carriers generated from the light-receiving region of the solid-state imaging element of the TOF camera is used. This data is referred to as distance image data with a low frequency of accumulating (input data). The image data with a low frequency of accumulating is obtained in an image generation portion.

In addition, the image data with a low frequency of accumulating may be subjected to pre-treatment so that estimation can be easily performed in the estimation portion.

As illustrated in FIG. 11, a learning model in which the input data is stored in the input portion 100, image processing is performed in the estimation portion 102, and the highest accuracy is obtained in an output portion 103 is used. Furthermore, a learning model that is likely to reduce noise is preferably used.

In this embodiment, U-net is used as the learning model and discrimination is performed on the basis of learned content. In the case, the estimation portion 102 has a U-shape short-cut structure (nested structure) similar to U-net. The estimation portion 102 forms a feature map with reduced number of elements by a convolution layer, a pooling layer, and an activation layer. Then, after input data 110 is down sampled a plurality of times, up-sampling is performed a plurality of times to obtain a depth map.

Figure 12:
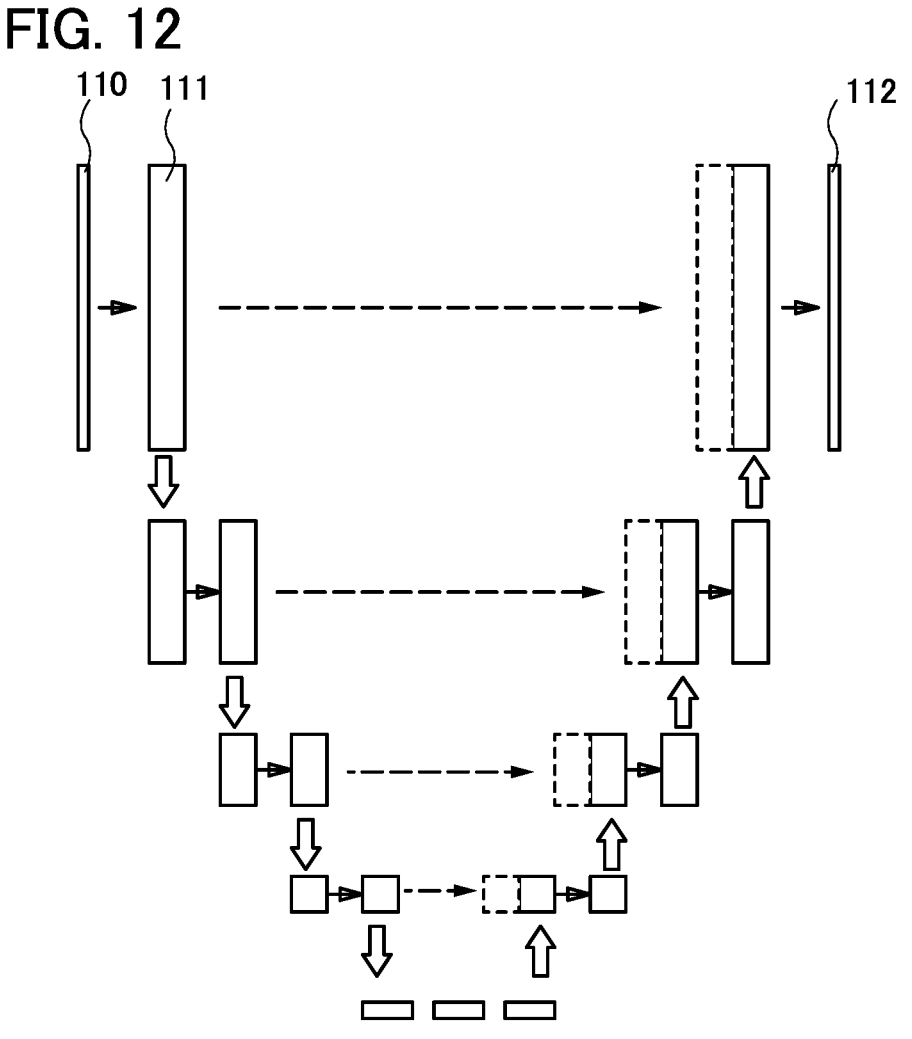
FIG. 12 is a schematic diagram of a U-Net network architecture.

FIG. 12 is a schematic diagram of a U-Net network architecture. Five stages of learning processes are illustrated in an example in FIG. 12, but as necessary, two stages, three stages, four stages, or six stages or more stages of learning processes may be conducted, without particular limitations.

A plurality of depth maps 111 can be obtained by extracting a feature quantity (or attention area) of the input data 110, that is, performing convolution.

An object in a measurement space can be estimated from the feature quantity (or attention region) of the input data 110 or the depth map 111. A shape of the object in the measurement space is estimated from the feature quantity extracted with the learning model and when the probability of identifying the object is high, the shape of the object can be estimated and the relative value of the distance can be predicted. Thus, the accuracy of the distance image can be increased.

In addition, a TOF camera having a low resolution than a TOF camera for learning can also be used. Even with the TOF camera having a low resolution, when learning data used for a learning model is obtained with a TOF camera with high accuracy, an output result can be approximate to a result obtained using the TOF camera with high accuracy. Moreover, image processing for removing noise of learned data is performed on learning data, so that a better output result can be obtained.

Specifically, the TOF camera with high accuracy means a case having not only a large number of pixels but also a large light-receiving area per pixel. Accordingly, even a TOF camera with a small light-receiving area per pixel can obtain a high-accurate depth map 112 as an output result that is equivalent to or better than that of a TOF camera having a large light-receiving area per pixel.

This embodiment is useful not only for a still image but also for a moving image. Data with a low frequency of accumulating can be used as input data; therefore, data can be obtained with a high frame frequency, which is suitable for a moving image.

Embodiment 6

Examples of electronic devices having a distance estimation device of one embodiment of the present invention or an imaging device of one embodiment of the present invention are described with reference to FIG. 13.

Examples of electronic devices including a distance estimation device of one embodiment of the present invention or an imaging device of one embodiment of the present invention include display devices of televisions, monitors, and the like; lighting devices; desktop or laptop personal computers; word processors; image reproduction devices that reproduce still images and moving images stored in recording media such as DVD (Digital Versatile Disc); portable CD players; radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information terminals; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as chain saws; smoke detectors; and medical equipment such as dialyzers. Other examples include industrial equipment such as guide lights, traffic lights, conveyor belts, elevators, escalators, industrial robots, power storage systems, and power storage devices for leveling the amount of power supply and smart grid.

In addition, moving objects and the like driven by electric motors using electric power from power storage devices are also included in the category of electronic devices. Examples of the moving objects include electric vehicles (EVs), hybrid electric vehicles (HVs) that include both an internal-combustion engine and a motor, plug-in hybrid electric vehicles (PHVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The electronic devices may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays), for example.

FIG. 13A to FIG. 13F show examples of electronic devices.

FIG. 13A illustrates an example of a watch-type portable information terminal. A portable information terminal 6100 includes a housing 6101, a display portion 6102, a band 6103, operation buttons 6105, and the like. The portable information terminal 6100 further includes a secondary battery inside and an imaging device of one embodiment of the present invention or an electronic component. For example, a TOF camera can be incorporated by installing a distance estimation device of one embodiment of the present invention or an imaging device of one embodiment of the present invention in part of the watch-type portable information terminal.

FIG. 13B shows an example of a cellular phone. A portable information terminal 6200 includes a display portion 6202 incorporated in a housing 6201, operation buttons 6203, a speaker 6204, a microphone 6205, and the like.

The portable information terminal 6200 further includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication by acquiring fingerprint patterns. As a light source for acquiring fingerprint patterns with the fingerprint sensor 6209, light emitted from the display portion 6202 can be used.

The portable information terminal 6200 further includes a secondary battery inside and an imaging device of one embodiment of the present invention or an electronic component. For example, a TOF camera can be incorporated by installing an imaging device of one embodiment of the present invention in part of the portable information terminal 6200. With use of the TOF camera, information regarding a figure (including a contour of a face or the like) of the user is obtained to perform personal verification.

FIG. 13C illustrates an example of a cleaning robot. A cleaning robot 6300 includes a display portion 6302 placed on the top surface of a housing 6301, a plurality of cameras 6303 placed on the side surface thereof, a brush 6304, operation buttons 6305, a variety of sensors, and the like. Although not illustrated, the cleaning robot 6300 is provided with a tire, an inlet, and the like. The cleaning robot 6300 is self-propelled, detects dust 6310, and sucks up the dust through the inlet provided on the bottom surface.

For example, the cleaning robot 6300 can determine whether there is an obstacle such as a wall, furniture, or a step by analyzing images taken by the cameras 6303. In the case where the cleaning robot 6300 detects an object, e.g., wiring, that is likely to be caught in the brush 6304 by image analysis, the rotation of the brush 6304 can be stopped. The camera 6303 can employ a plurality of kinds of systems of imaging devices; a distance estimation device of one embodiment of the present invention or an imaging device of one embodiment of the present invention is used for one of the cameras 6303, whereby the distance information is obtained from information of a captured image to reduce malfunction of the cleaning robot 6300.

FIG. 13D illustrates an example of a robot. A robot 6400 illustrated in FIG. 13D includes an arithmetic device 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of the user, an environmental sound, and the like. The speaker 6404 has a function of outputting sound. The robot 6400 can communicate with the user using the microphone 6402 and the speaker 6404.

The display portion 6405 has a function of displaying various kinds of information. The robot 6400 can display information desired by the user on the display portion 6405. The display portion 6405 may be provided with a touch panel. Moreover, the display portion 6405 may be a detachable information terminal, in which case charging and data communication can be performed when the display portion 6405 is set at the home position of the robot 6400.

The upper camera 6403 and the lower camera 6406 have a function of taking an image of the surroundings of the robot 6400. The upper camera 6403 and the lower camera 6406 can employ a plurality of kinds of systems of imaging devices; a distance estimation device of one embodiment of the present invention or an imaging device of one embodiment of the present invention is used for one of the upper camera 6403 and the lower camera 6406, whereby the distance information is obtained from information of a captured image to reduce malfunction in movement of the transmission robot 6400. The obstacle sensor 6407 can detect an obstacle in the direction where the robot 6400 advances with the moving mechanism 6408. The robot 6400 can move safely by recognizing the surroundings with the upper camera 6403, the lower camera 6406, and the obstacle sensor 6407.

FIG. 13E illustrates an example of a flying object. A flying object 6500 illustrated in FIG. 13E includes propellers 6501, a camera 6502, a battery 6503, and the like and has a function of flying autonomously.

For example, image data taken by the camera 6502 is stored in an electronic component 6504. The electronic component 6504 can analyze the image data to detect whether there is an obstacle in the way of the movement. The camera 6502 can employ a plurality of kinds of systems of imaging devices; an imaging device of one embodiment of the present invention is used for one of the cameras 6502, whereby the distance information is obtained from information of a captured image to reduce malfunction in movement of the flying object 6500.

FIG. 13F illustrates an example of an automobile. An automobile 7160 includes an engine, tires, a brake, a steering gear, a plurality of cameras, and the like. When an imaging device of one embodiment of the present invention is used for one or more of the plurality of cameras of the automobile 7160, distance information between the automobile and an external object can be obtained from information of a captured image and the positional relationship between the object and the automobile in the traveling direction of the automobile 7160 or in the surroundings of the automobile 7160 can be recognized. By using a distance estimation device of one embodiment of the present invention or an imaging device of one embodiment of the present invention for the automobile 7160, an analog function of an autopilot function of the automobile 7160 can be assisted.

The configuration, structure, method, and the like described in this embodiment can be used in combination as appropriate with the configurations, structures, methods, and the like described in the other embodiments.

REFERENCE NUMERALS

11: illumination unit, 12: sensor unit, 13: signal generation unit, 14: correlation and evaluation unit, 21: transistor, 22: transistor, 23: transistor, 24: transistor, 25: transistor, 31: transistor, 32: transistor, 33: transistor, 41: capacitor, 42: capacitor, 43: capacitor, 44: transistor, 45: dotted arrow, 46: dotted arrow, 60: p-type region, 61: p− region, 62: n-type surface embedded region, 63: p+ region, 64: charge-accumulation region, 65: charge-draining region, 66: p-well region, 70: insulating layer, 71: pair of transfer gates, 72: pair of transfer gates, 73: pair of transfer gates, 74: pair of transfer gates, 75: insulating layer 76: connection electrode, 90: light-receiving region, 91: light-shielding plate, 100: input portion, 101: transistor, 102: estimation portion, 103: output portion, 110: input data, 111: depth map, 112: high-accurate depth map, 115: substrate, 120: insulating layer, 130: oxide semiconductor layer, 130a: oxide semiconductor layer, 130b: oxide semiconductor layer, 130c: oxide semiconductor layer, 140: conductive layer, 150: conductive layer, 160: insulating layer, 170: conductive layer, 171: conductive layer, 172: conductive layer, 175: insulating layer, 180: insulating layer, 231: region, 232: region, 233: region, 6100: portable information terminal, 6101: housing, 6102: display portion, 6103: band, 6105: operation button, 6200: portable information terminal, 6201: housing, 6202: display portion, 6203: operation button, 6204: speaker, 6205: microphone, 6209: fingerprint sensor, 6300: cleaning robot, 6301: housing, 6302: display portion, 6303: camera, 6304: brush, 6305: operation button, 6310: dust, 6400: robot, 6401: illuminance sensor, 6402: microphone, 6403: upper camera, 6404: speaker, 6405: display portion, 6406: lower camera, 6407: obstacle sensor, 6408: moving mechanism, 6409: arithmetic device, 6500: flying object, 6501: propeller, 6502: camera, 6503: battery, 6504: electronic component, 7160: automobile

The invention claimed is:

1. An imaging device comprising:

a light-receiving region embedded in a semiconductor wafer;

a plurality of charge-accumulation regions around the light-receiving region;

a first insulating layer covering the light-receiving region and the plurality of charge-accumulation regions;

a second insulating layer over the first insulating layer;

a transistor comprising an oxide semiconductor in a channel formation region over the second insulating layer, the oxide semiconductor being electrically connected to one of the plurality of charge-accumulation regions; and a light-shielding plate overlapping with the plurality of charge-accumulation regions and the transistor, wherein the light-receiving region comprises a first region having a first conductivity type, a second region having a second conductivity type on the first region, a third region having the first conductivity type on the second region, a part of the first insulating layer on the third region, and a part of the second insulating layer on the first insulating layer.

2. The imaging device according to claim 1, wherein the light-shielding plate comprises an opening overlapping with the light-receiving region.

3. The imaging device according to claim 1, wherein the light-receiving region is a light-receiving area of an embedded photodiode.

4. The imaging device according to claim 1, wherein the light-receiving region is a light-receiving area of an avalanche photodiode.

5. The imaging device according to claim 1, further comprising a stack of insulating layers over the plurality of charge-accumulation regions, wherein the stack of insulating layers comprises an opening partly overlapped with the light-receiving region.

6. The imaging device according to claim 1, wherein the plurality of charge-accumulation regions each have the second conductivity type.

7. An imaging device comprising:

a semiconductor wafer where at least a light-receiving region, a charge-accumulation region, and a first transistor are embedded;

a first insulating layer covering the light-receiving region and the charge-accumulation region;

a second insulating layer over the first insulating layer; and a second transistor over the second insulating layer, the second transistor electrically connected to the charge-accumulation region, wherein the light-receiving region comprises a first region having a first conductivity type, a second region having a second conductivity type on the first region, a third region having the first conductivity type on the second region, a part of the first insulating layer on the third region, and a part of the second insulating layer on the first insulating layer, wherein the charge-accumulation region is configured to be one a source and a drain of the first transistor, and wherein the second transistor comprises an oxide semiconductor in a channel formation region.

8. The imaging device according to claim 7, further comprising a light-shielding plate, wherein the light-shielding plate is overlapped with the charge-accumulation region, the first transistor, and the second transistor.

9. The imaging device according to claim 8, wherein the light-shielding plate comprises an opening overlapping with the light-receiving region.

10. The imaging device according to claim 7, wherein the light-receiving region is a light-receiving area of an embedded photodiode.

11. The imaging device according to claim 7, wherein the light-receiving region is a light-receiving area of an avalanche photodiode.

12. The imaging device according to claim 7, further comprising a stack of insulating layers over the charge-accumulation region, wherein the stack of insulating layers comprises an opening overlapped with the light-receiving region.

13. The imaging device according to claim 7, wherein the charge-accumulation region has the second conductivity type.

14. The imaging device according to claim 7, wherein the first transistor comprises a gate electrode provided over the first insulating layer.

* * * * *